US009189579B2

(12) United States Patent
Brideson et al.

(10) Patent No.: US 9,189,579 B2
(45) Date of Patent: *Nov. 17, 2015

(54) TECHNIQUES TO AUTOMATICALLY GENERATE SIMULATED INFORMATION

(71) Applicant: SAS INSTITUTE INC., Cary, NC (US)

(72) Inventors: William Lee Brideson, Raleigh, NC (US); Jan W. Squillace, Cary, NC (US)

(73) Assignee: SAS INSTITUTE, INC., Cary, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/223,404

(22) Filed: Mar. 24, 2014

(65) Prior Publication Data
US 2014/0249795 A1 Sep. 4, 2014

Related U.S. Application Data

(63) Continuation of application No. 12/538,097, filed on Aug. 7, 2009, now Pat. No. 8,725,487.

(51) Int. Cl.
G06F 9/45 (2006.01)
G06F 17/50 (2006.01)
G06F 9/44 (2006.01)
G06F 11/34 (2006.01)

(52) U.S. Cl.
CPC .............. *G06F 17/5009* (2013.01); *G06F 8/35* (2013.01); *G06F 11/3414* (2013.01); *G06F 11/3466* (2013.01); *G06F 2201/80* (2013.01); *G06F 2201/865* (2013.01)

(58) Field of Classification Search
CPC ............ G06F 17/5022; G06F 11/3447; G06F 11/3457; G06F 17/5009; G06F 11/3664
USPC .......................................................... 703/22
See application file for complete search history.

(56) References Cited

U.S. PATENT DOCUMENTS 6,389,379 B1 * 5/2002 Lin et al. .......................... 703/14

OTHER PUBLICATIONS

Hammouda et al. "A Fully Automated Approach for Analog Circuit Reuse" IEEE 2004.*
Korel "Automated Software Test Data Generation" IEEE 1990.*

* cited by examiner

*Primary Examiner* — Saif Alhija
(74) *Attorney, Agent, or Firm* — Kacvinsky Daisak Bluni PLLC

(57) ABSTRACT

Techniques to automatically generate simulated information are described. A method comprises receiving, by a program builder component executed on a processor, a structured input file comprising one or more data libraries and one or more directive files to generate simulated data for a simulation database. The method further comprising producing, by the program builder component executed on the processor, a data generator program based on the structured input file, the data generator program arranged to generate the simulated data for the simulation database using multiple data generating sessions executed concurrently or sequentially. Other embodiments are described and claimed.

49 Claims, 18 Drawing Sheets

Initial Values
Data Library 202-2

Table 402

| Store ID | Street Address | Postal Code |
|---|---|---|
| 1 | 204 North Blount Street | 27601 |
| 2 | 1650 Pennsylvania Avenue | 20500 |
| 3 | 352 Fifth Avenue | 10118 |
| 4 | 701 North First Street | 63102 |

*FIG. 4*

Data View
Data Library 202-3

```
/*-----------------------------------------------------------------*
   Read a date and see which day of the week it is (Sunday is
   the first day of the week where this application runs).
 *-----------------------------------------------------------------*/
set datain.dates;
i = weekday( date_id );
/*-----------------------------------------------------------------*
   This enterprise makes half of its sales on Friday, Saturday,
   and Sunday, so generate 3 of the 6 dates on those days.
 *-----------------------------------------------------------------*/
if ( (i = 1) or (i = 6) or (i = 7) ) then do j = 1 to 3;
    output;
    end;
/*-----------------------------------------------------------------*
   Wednesdays and Thursdays aren't too bad, so generate one-
   third (2 of the 6) dates on those days.
 *-----------------------------------------------------------------*/
else if ( (i = 4) or (i = 5) ) then do j = 1 to 2;
    output;
    end;
/*-----------------------------------------------------------------*
   Mondays and Tuesdays are pretty light, so only generate
   one-sixth (1 of the 6) dates on those days.
 *-----------------------------------------------------------------*/
else do;
    output;
    end;
```

*View 502*

*FIG. 5*

Rules Data Library 202-4

*Data Sources 124-1-a*

*Table=CUSTOMERS*

Table 602-1

| Column | Type of Source | Name of Source |
|---|---|---|
| CUST_AGEGROUP | Emitter | sas_3_key_scan |
| CUST_FIRSTNAME | Conditional | c_fn |
| CUST_GENDER | Emitter | sas_3_key_scan |
| CUST_ID | Emitter | sas_1_counter |
| CUST_LASTNAME | Emitter | sas_3_list_select |
| CUST_POSTALCODE | Emitter | sas_3_list_select |
| CUST_STREETADDR | Emitter | sas_3_include |

*Table=DATES*

Table 602-2

| Column | Type of Source | Name of Source |
|---|---|---|
| DATE_ID | Emitter | sas_1_date_rg |
| DAY_OF_WEEK | Emitter | sas_3_handgen |
| HOLIDAY | Conditional | d_h |
| SEASON | Conditional | d_s |

*Table=PRODUCTS*

Table 602-3

| Column | Type of Source | Name of Source |
|---|---|---|
| PRODUCT_ID | Emitter | sas_1_counter |
| PRODUCT_NAME | Emitter | sas_2_pref_ref_cnt |
| PRODUCT_PRICE | Emitter | sas_1_prob_dist |

*Table=SALES*

Table 602-4

| Column | Type of Source | Name of Source |
|---|---|---|
| DATE_ID | View | gen_date_ids |
| ORDER_ID | Emitter | sas_1_counter |
| QUANTITY | Emitter | sas_1_range |
| STORE_ID | Emitter | sas_3_include |

FIG. 6A

Rules Data Library 202-4

Table=CUSTOMERS

Table 602-5

| Column | Name of Source | Reference Column | Name of Group | Position in Group |
|---|---|---|---|---|
| CUST_AGEGROUP | sas_3_key_scan | | grp_1 | 3 |
| CUST_FIRSTNAME | c_fn | CUST_GENDER | | . |
| CUST_GENDER | sas_3_key_scan | | grp_1 | 2 |
| CUST_ID | sas_1_counter | | | . |
| CUST_LASTNAME | sas_3_list_select | | | . |
| CUST_POSTALCODE | sas_3_list_select | | grp_1 | 1 |
| CUST_STREETADDR | sas_3_include | CUST_POSTALCODE | | . |

FIG. 6B

Rules Data Library 202-4

Table=DATES

Table 602-6

| Column | Name of Source | Numeric Parameter 1 | Numeric Parameter 2 | Numeric Parameter 3 |
|---|---|---|---|---|
| DATE_ID | sas_1_date_rg | 17532 | 17897 | . |
| DAY_OF_WEEK | sas_3_handgen | 1 | . | . |

Table=PRODUCTS

Table 602-7

| Column | Name of Source | Numeric Parameter 1 | Numeric Parameter 2 | Numeric Parameter 3 |
|---|---|---|---|---|
| PRODUCT_PRICE | sas_1_prob_dist | 0 | 100 | 2 |

Table=SALES

Table 602-8

| Column | Name of Source | Numeric Parameter 1 | Numeric Parameter 2 | Numeric Parameter 3 |
|---|---|---|---|---|
| QUANTITY | sas_1_range | 1 | 20 | 1 |

*FIG. 6C*

Rules Data Library 202-4

Table=CUSTOMERS

Table 602-9

| Column | Name of Source | Character Parameter 1 | Character Parameter 2 | Character Parameter 3 |
|---|---|---|---|---|
| CUST_AGEGROUP | sas_3_key_scan | reflib.ks_zip_sex_2_age | keyscan | |
| CUST_GENDER | sas_3_key_scan | reflib.ks_zip_2_sex | keyscan | |
| CUST_LASTNAME | sas_3_list_select | reflib.n_l | LastName | |
| CUST_POSTALCODE | sas_3_list_select | reflib.popwt | | |
| CUST_STREETADDR | sas_3_include | includes(address) | | |

Table=DATES

Table 602-10

| Column | Name of Source | Character Parameter 1 | Character Parameter 2 | Character Parameter 3 |
|---|---|---|---|---|
| DAY_OF_WEEK | sas_3_handgen | weekday(date_id) | | |

Table=PRODUCTS

Table 602-11

| Column | Name of Source | Character Parameter 1 | Character Parameter 2 | Character Parameter 3 |
|---|---|---|---|---|
| PRODUCT_NAME | sas_2_pref_ref_cnt | Product | Z6. | C N |
| PRODUCT_PRICE | sas_1_prob_dist | GAMMA | | |

Table=SALES

Table 602-12

| Column | Name of Source | Character Parameter 1 | Character Parameter 2 | Character Parameter 3 |
|---|---|---|---|---|
| STORE_ID | sas_3_include | includes(gen_store_ids) | | |

*FIG. 6D*

Rules Data Library 202-4

Table 602-13

| Name of Composite | Position in Composite | Type of Source | Name of Source | Character Parameter 1 | Character Parameter 2 |
|---|---|---|---|---|---|
| c_fn | 1 | Emitter | sas_3_list_select | reflib.n_fm | FirstName |
| c_fn | 2 | Emitter | sas_3_list_select | reflib.n_ff | FirstName |
| d_h | 1 | Emitter | sas_3_constant | 1 | ASSIGN |
| d_h | 2 | Emitter | sas_3_constant | 1 | ASSIGN |
| d_h | 3 | Emitter | sas_3_constant | 1 | ASSIGN |
| d_h | 4 | Emitter | sas_3_constant | 1 | ASSIGN |
| d_h | 5 | Emitter | sas_3_constant | 1 | ASSIGN |
| d_h | 6 | Emitter | sas_3_missing |  | ASSIGN |
| d_s | 1 | Emitter | sas_3_constant | V | ASSIGN |
| d_s | 2 | Emitter | sas_3_constant | P | ASSIGN |
| d_s | 3 | Emitter | sas_3_constant | U | ASSIGN |
| d_s | 4 | Emitter | sas_3_constant | F | ASSIGN |
| d_s | 5 | Emitter | sas_3_constant | C | ASSIGN |
| d_s | 6 | Emitter | sas_3_missing |  | ASSIGN |

*FIG. 6E*

Rules Data Library 202-4

Table 602-14

| Name of Composite | Position in Composite | Logical (Conditional) Expression |
|---|---|---|
| c_fn | 1 | (cust_gender eq 'M') |
| c_fn | 2 | |
| d_h | 1 | ('26may2008'd eq date_id) |
| d_h | 2 | ('04jul2008'd eq date_id) |
| d_h | 3 | ('01sep2008'd eq date_id) |
| d_h | 4 | ('27nov2008'd eq date_id) |
| d_h | 5 | ('25dec2008'd eq date_id) |
| d_h | 6 | |
| d_s | 1 | ('01feb2008'd le date_id le '14feb2008'd) |
| d_s | 2 | ('15mar2008'd le date_id le '31may2008'd) |
| d_s | 3 | ('01jun2008'd le date_id le '31aug2008'd) |
| d_s | 4 | ('01sep2008'd le date_id le '31oct2008'd) |
| d_s | 5 | ('24nov2008'd le date_id le '25dec2008'd) |
| d_s | 6 | |

FIG. 6F

Cross Reference File 204-1

Table 702

| Primary Key: Table Name | Primary Key: Column Name | Foreign Key: Column Name | Foreign Key: Table Name |
|---|---|---|---|
| customers | cust_id | cust_id | sales |
| products | product_id | product_id | sales |

FIG. 7

Table Attribute File 204-2

Table 802

| Table Name | Table Type | Number of Rows |
|---|---|---|
| customers | R | 2000 |
| stores | R | 4 |
| products | R | 50 |
| dates | R | 366 |
| sales | M | 10000 |

```
RECEIVE BY A PROCESSOR A STRUCTURED INPUT FILE
WITH DEFINITIONS TO GENERATE SIMULATED DATA FOR A
SIMULATION DATABASE
1002
```

```
PRODUCE BY THE PROCESSOR A DATA GENERATOR
PROGRAM BASED ON THE STRUCTURED INPUT FILE, THE
DATA GENERATOR PROGRAM ARRANGED TO GENERATE
THE SIMULATED DATA FOR THE SIMULATION DATABASE
USING MULTIPLE DATA SOURCES AND MULTIPLE DATA
GENERATION SESSIONS EXECUTED CONCURRENTLY OR
SEQUENTIALLY
1004
```

```
COMPILE A SOURCE CODE VERSION OF THE DATA
GENERATOR PROGRAM INTO AN EXECUTABLE CODE
VERSION OF THE DATA GENERATOR PROGRAM
1006
```

```
GENERATE SIMULATED DATA FOR TABLES OF THE
SIMULATION DATABASE USING MULTIPLE COMPUTATIONAL
PHASES UNTIL ALL TABLES FOR THE SIMULATION
DATABASE ARE POPULATED
1008
```

*FIG. 10*

TECHNIQUES TO AUTOMATICALLY GENERATE SIMULATED INFORMATION

The present application is a continuation of and claims the benefit of earlier filed U.S. patent application Ser. No. 12/538,097, filed on Aug. 7, 2009, which is incorporated by reference herein.

BACKGROUND

A database management system (DBMS) is a collection of software that generally manages databases. For instance, a DBMS may allow a user or an application to store, retrieve and display information in a structured manner. To gain a competitive advantage, organizations are gathering increasing volumes of information about their customers, operations, market, competitors, performance and more. Organizations may then use various types of application software (e.g., business analytics software) to interact with the DBMS in order to analyze the growing volumes of database information to assist in making strategic business decisions. The sheer volume of database information combined with increasingly complex application programs designed to interact with a DBMS, however, produce a new level of challenges for database design, testing, implementation and management. It is with respect to these and other considerations that the present improvements are needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Various embodiments are generally directed to techniques to automatically generate simulated data for a database. Some embodiments are particularly directed to techniques to automatically generate large and scalable volumes of complex simulated data for a simulation database. An application program, such as a database application program, may then use the simulated data and the simulation database in various use scenarios, such as to measure performance of the application program, for example.

In one embodiment, for example, an apparatus may comprise a processor and a memory unit. The memory unit may store a program builder component that when executed by the processor is operative to receive a structured input file with definitions to generate simulated data for a simulation database, and produce a data generator program based on the structured input file. The data generator program may be arranged to generate the simulated data for the simulation database. The data generator program may generate the simulated data using multiple data generating sessions executed concurrently or sequentially. Other embodiments are described and claimed.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

FIG. 4 illustrates an embodiment of an initial values data library.
FIG. 5 illustrates an embodiment of a data view data library.
FIG. 6A illustrates an embodiment of a first rules data library.
FIG. 6B illustrates an embodiment of a second rules data library.
FIG. 6C illustrates an embodiment of a third rules data library.
FIG. 6D illustrates an embodiment of a fourth rules data library.
FIG. 6E illustrates an embodiment of a fifth rules data library.
FIG. 6F illustrates an embodiment of a sixth rules data library.
FIG. 7 illustrates an embodiment of a cross-reference file.
FIG. 8 illustrates an embodiment of a table attribute file.
FIG. 10 illustrates an embodiment of a first logic flow.

DETAILED DESCRIPTION

Figure 1:
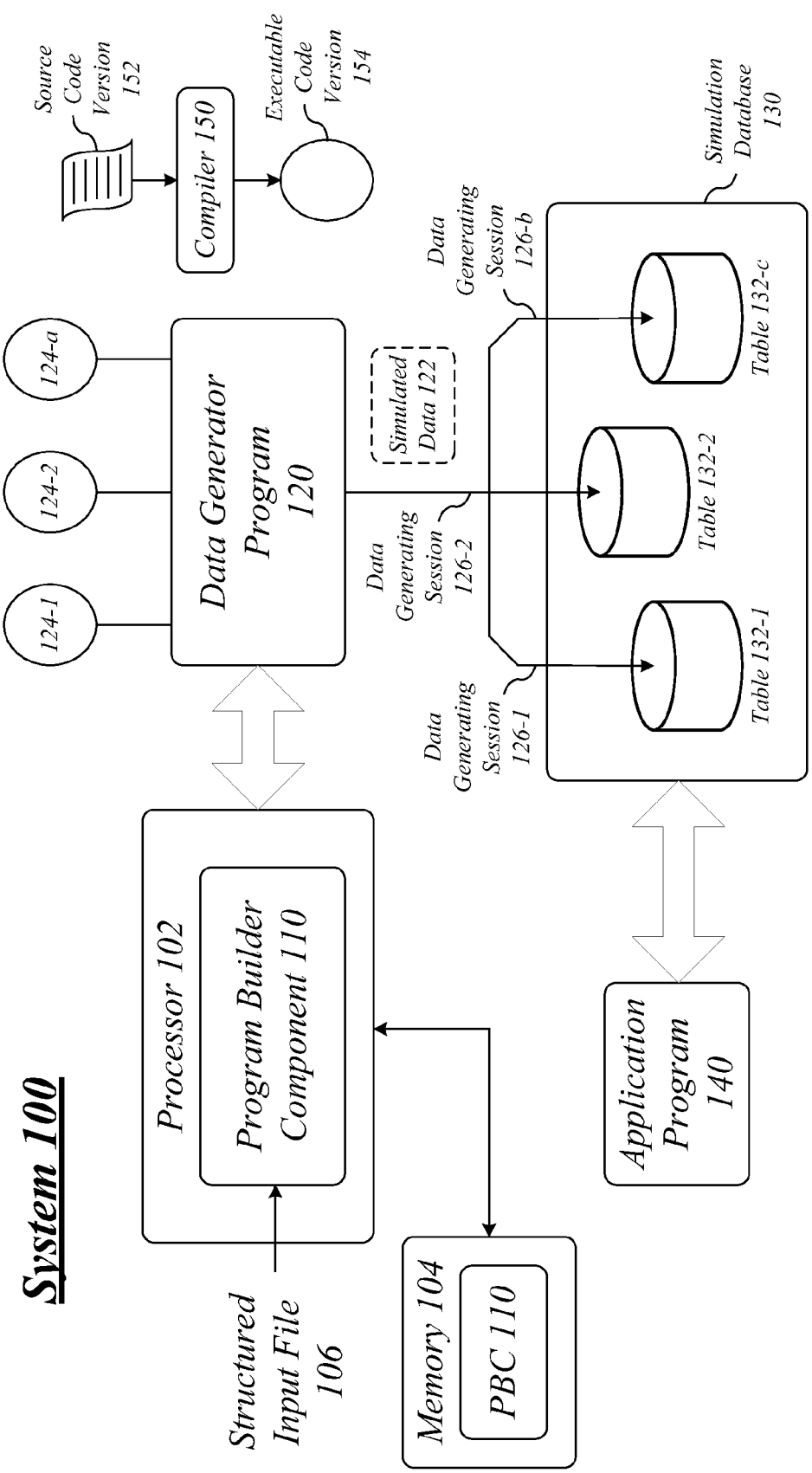
FIG. 1 illustrates an embodiment of a first system.

Organizations typically use application programs that process and use volumes of data stored and managed by a DBMS. For example, an application program for business planning, customer management, accounting or business analytics may use large volumes of sales, product and customer data. As a general rule, a given volume of data for the DBMS increases with the size of the organization and complexity of the application program.

In some cases, an organization may desire to use simulated data rather than actual data for a DBMS. For instance, an organization may desire to engage in performance measurement and functional testing for an application program prior to actually deploying the application program. An example of an application program may include application programs made by SAS® Institute Inc., of Cary, N.C., although the embodiments are not limited in this context. This may be particularly important when an application program supports critical functions for the organization. In another example, an organization may desire to provide a demonstration for an application program or DBMS but would like to avoid using actual data with confidential or secure information. In this case, the organization may desire to create simulated data that mimics actual data for such demonstration purposes. Other use scenarios may include feasibility studies, product testing, statistical analysis, productivity or performance measurements, and other projects that benefit from the use of simulated data in lieu of actual data.

Ideally, simulated data should mimic and have characteristics similar to actual data for the organization. This facilitates increased accuracy in measurement and testing. Consequently, generating the simulated data requires careful analysis and synthesis to ensure the simulated data is suitable for a given use scenario. In some cases, the simulated data may even be actual data that has been "sanitized" to remove sensitive or secure data while retaining essential characteristics of the original.

Conventional solutions for generating simulated data are unsatisfactory for a number of reasons. For example, data generators are typically manually programmed, which is a slow, complex and error-prone process. Further, organizations are increasingly using complex application programs that process and use massive volumes of data typically stored by a DBMS. Populating a database that has hundreds of tables and thousands of columns with simulated data can be prohibitively expensive and laborious for the user. Further, characteristics of the generated data are limited to the functionality built into each data generator. Lack of extensibility means that extremely complex data requirements can exceed the available functionality. In addition, a data generator is typically meant to operate alone and not with other data generators. As such, multiple computers cannot be used to generate the simulated data. Rather, the rate of data generation is limited to the speed at which one session on one computer can work. Furthermore, references across tables are difficult, inefficient, or impossible to maintain in the simulated data. Conventional data generators are not capable of moving beyond referential integrity to include columns that are logically associated even though they are not defined as primary or foreign keys. Finally, support for importing extant data is limited or nonexistent.

Embodiments attempt to solve these problems by taking a different approach to the work of generating simulated data. Embodiments automatically generate a data generator program based on a structured input file. The structured input file may generally comprise one or more input files with data generation specifications and definitions useful for automatically producing a data generator program. The data generator program may then be independently executed to generate simulated data of various types and varying levels of complexity for the simulation database. For larger more complex systems, the data generator program may generate the simulated data using multiple computers over multiple data generating sessions executed in a concurrent or sequential manner, thereby building and populating a simulation database with simulated data at a much faster rate than conventional data generators. An application program may then use the simulated data and the simulation database in various use scenarios, such as to measure performance of the application program, for example. As a result, the embodiments can improve affordability, scalability, modularity, extendibility, or interoperability for application programs and larger volume databases managed as part of a DBMS.

FIG. 1 illustrates a block diagram for a system 100 designed to automatically generate a data generator program capable of generating simulated data for a simulation database. The system 100 may be implemented as part of a computing system, an example of which is described in more detail with reference to FIG. 12. Although the system 100 as shown in FIG. 1 has a limited number of elements in a certain topology, it may be appreciated that the system 100 may include more or less elements in alternate topologies as desired for a given implementation.

In various embodiments, the system 100 may comprise a computer-implemented system 100 having multiple components, programs or modules. As used herein these terms are intended to refer to a computer-related entity, comprising either hardware, a combination of hardware and software, software, or software in execution. For example, a component can be implemented as a process running on a processor 102, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers as desired for a given implementation. The embodiments are not limited in this context.

In the illustrated embodiment shown in FIG. 1, the system 100 may be implemented as part of an electronic device. Examples of an electronic device may include without limitation a mobile device, a personal digital assistant, a mobile computing device, a smart phone, a cellular telephone, a handset, a one-way pager, a two-way pager, a messaging device, a computer, a personal computer (PC), a desktop computer, a laptop computer, a notebook computer, a handheld computer, a server, a server array or server farm, a web server, a network server, an Internet server, a work station, a mini-computer, a mainframe computer, a supercomputer, a network appliance, a web appliance, a distributed computing system, multiprocessor systems, processor 102-based systems, consumer electronics, programmable consumer electronics, television, digital television, set top box, wireless access point, base station, subscriber station, mobile subscriber center, radio network controller, router, hub, gateway, bridge, switch, machine, or combination thereof.

The various components of system 100 may be communicatively coupled via various types of communications media as indicated by various lines or arrows. The components may coordinate operations between each other. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

In the illustrated embodiment shown in FIG. 1, the system 100 may comprise one or more processors 102 and one or more memory units 104 communicatively coupled to the processors 102. The memory unit 104 may store a program builder component 110 (and support files) that when executed by the processor 102 is operative to receive one or more files in the structured input file 106 having definitions to generate simulated data 122 for a simulation database 130, and produce a data generator program 120 based on the structured input file 106. When independently executed, the data generator program 120 may generate the simulated data 122 for the simulation database 130. In some cases, the data generator program may generate the simulated data over multiple data generating sessions 126-1-b executed in a concurrent or sequential manner. This may accelerate completion of the simulation database 130. An application program 140 may then use the simulated data 122 and the simulation database 130 for various use scenarios, such as to evaluate the application program 140 prior to purchase and deployment, among others.

The structured input file 106 may generally comprise one or more input files with data generation specifications and definitions useful for automatically producing a data generator program 120. Although a specific type of structured input file 106 is described with various embodiments, the structured input file 106 may utilize any format as long as the input files are structured in a known and well-defined manner.

The structured input file 106 provides information about the simulated data 122 and the simulation database 130, among other types of information. For instance, the structured input file 106 provides information about a computing environment in which the data generator program 120 will run, the type of simulated data 122 required by each column of the tables 132-1-c of the simulation database 130, how to generate each type of simulated data 122, relationships between columns in the same table 132-1-c and columns in different tables 132-1-c, and other information pertinent to generating database objects. Changes to the structured input file 106 may produce different data generator programs 120 capable of generating different types of simulated data 122 for the simulation database 130. It is worthy to note that the structured input file 106 to the program builder component 110 is not procedural implementations of an algorithm, as would be the case for FORTRAN, PL/I, C, Pascal, Java, and other programming languages. Instead, the input files to the program builder component 110 contain specifications for the simulated data 122 and the simulation database 130.

In one embodiment, for example, the structured input file 106 may comprise a data generation specification created in a structured and well-defined manner. Designing a database typically begins with the generation of a database design document. This document is produced by any combination of an application development team, a client, data modelers, database administrators and a system development team. The database design document generally contains information defining an organization for a database application program and includes definitions of the database, tablespace, table, columns and their attributes. For a complex database application program, for example an accounting, inventory control or personnel system, the database design document is complicated and can take many weeks or months to develop.

After the completion of the database design document, it is provided to one or more database administrators who are responsible for manually translating the design into a language provided by the DBMS. This language, sometimes referred to as a Database Definition Language (DDL), is used to define or describe the database objects and to define the structure and format of the database. In some instances, one or more database administrators manually code the program code using the database design document as a guide. This is a typically a highly complex, expensive and time-consuming process, subject to specialized knowledge, inconsistencies, errors, rewrites, versioning problems, and so forth.

To avoid these and other problems associated with manually populating a database, embodiments may comprise a program builder component 110 designed to automatically produce a data generator program 120 using the structured input file 106. The automatic production of the data generation program 120 provides many technical advantages relative to manually populating a database. For instance, this automation reduces or eliminates the need for specialized knowledge (e.g., DBMS language and syntax) and multiple database administrators to create database objects for the implementation of a database application program. In addition, since the program builder component 110 automatically translates the structured input file into the proper program code, there are reduced instances of typographical errors, omissions or inconsistencies between the generated data and the requirements of the application program 140. This can lead to the communication of more accurate information to the users and developers of the system. Furthermore, during the design and implementation of complex systems, there are often many changes to the database design after initial implementation. For example, changes may be needed for the simulated data, simulation database or application program itself. When this occurs, the structured input file 106 may be updated and a new data generator program 120 may be produced accordingly. This avoids wasted effort in rewriting portions of the program code which is a difficult and time-consuming process. Also, there are a large number of database systems and programming languages which are in use or being developed. The structured input file 106, the program builder component 110 or the data generator program 120 may all be modified to work with the unique language and syntax associated with different database systems and programming languages. These are merely a few of the exemplary advantages associated with the embodiments, and others exist as well.

In various embodiments, the program builder component 110 comprises one or more computer programs that are specifically designed to build, create, program or otherwise produce different types of data generator programs 120. In general, the program builder component 110 is arranged to read a set of input files comprising the structured input file 106, determines which tables 132-1-c for the simulation database 130 will be populated, determines the order in which the tables 132-1-c will be populated, and assigns tables 132-1-c to particular data generating sessions 126-1-b. When appropriate, the program builder component 110 writes specialized program code that manages data generation for tables 132-1-c that are populated by multiple data generating sessions 126-1-b. The program builder component 110 also writes program code to the data generator program 120 that executes and synchronizes the data generating sessions 126-1-b. The program builder component 110 further creates computational phases in the data generator program 120 that build one or more tables 132-1-c. The program builder component 110 writes program code to the computational phases that populates each column of each table 132-1-c. The program builder component 110 may also provide various administrative tools, such as generating reports (e.g., error reports), diagnostic capabilities (e.g., error checking, performance measurements), file management (e.g., retrieve, create, modify, delete), and other routine operations.

The program builder component 110 is fundamentally a sequencing machine. It uses dependencies between tables to determine the order in which tables are generated, it uses the dependencies between columns to determine the order in which the columns of a table are generated, and it uses properties of columns to determine whether additional operations are required to prepare data for a column before the final assembly of a table 132-1-c.

As the program builder component 110 reaches the point at which the simulated data 122 for each column is to be generated, it uses the structured input file 106 for column information and writes program code statements to the data generator program 120 that will be later used to actually generate simulated data 122 for the column. This provides a technical advantage over conventional (manual) solutions since automation removes the need for maintaining the correct sequence of operations at several levels in addition to keeping track of where the statements required to generate each column belong. Instead, the program builder component 110 takes care of all of the program organization and inserts the statements to generate the simulated data 122 for each column where they belong. The user can then concentrate on exactly what is needed to generate the simulated data 122 for each individual column, so their time is used much more efficiently.

As the complexity of the application program 140 increases, so does the variety and complexity needed for the simulated data 122. As a result, the program builder component 110 may utilize different code sources 124-1-a to generate the different types of program code statements needed for a given data generator program 120. In various embodiments, the program builder component 110 may select and write program code statements to the data generator program 120 from one or more code sources 124-1-*a*. A code source 124-1-*a* may include any source of computer programming code or program code statements, including without limitation existing code generators, user-written code generators, views that contain pre-packaged program code statements, user-written data generation code that is executed as supplied, user written code that can "post-process" a table after its simulated data has been generated, application program interfaces (APIs), code libraries, program libraries, programs, and other code sources. The use of multiple code sources 124-1-*a* provides a high-level of extensibility for the data generator program 120. This extensibility is sometimes called a "plug-in architecture."

The program builder component 110 also provides for generating different sizes of the simulation database 130. This may be particularly advantageous when attempting to generate a data generator program 120 capable of populating larger commercial databases. For instance, a database is typically composed of two types of tables. A first type of table grows roughly in proportion to the size of the database. This type of table is generally referred to as a "fact" table or "main" table. A second type of table has a fixed size. This type of table is generally referred to as "dimension" table or "reference" table. The structured input file 106 provides a way to identify each table as a main table or a reference table. The program builder component 110 uses this information to write the data generator program 120 so the correct number of rows is generated for each table as the requested size of the generated simulation database 130 varies. This reduces or eliminates the need for a user to keep track of, and adjust, the number of rows in each table in order to generate databases of different sizes.

The program builder component 110 does not necessarily require a precise specification of the order in which the data for the columns in a table is generated. This is because the program builder component 110 provides support for the cases in which the data for one column must be generated after the data for another column has been generated. A basic parent-child relationship between columns can be expressed in a column description provided by the structured input file 106 by specifying that the current column depends on another column. Only one parent should be specified for each column. A column can have zero or more children. A column can be both a parent and a child, e.g., column C can depend on column B and column B can depend on column A. In this case, the program builder component 110 emits program code to generate simulated data 122 for column A, then simulated data 122 for column B (derived from column A), then simulated data 122 for column C (derived from column B). Alternatively, the column description of the structured input file 106 can be used to place columns in groups and to specify the position of each column in each group. Zero or more groups can be created for each table. This can be used to ensure that if the simulated data 122 in a given column depends on data from two or more other columns, the parent columns are generated before the child column. In addition, statements can be supplied that execute at the beginning or end (or both) of the group to satisfy a requirement for complex data.

In addition to the data generator program 120, the program builder component 110 may produce various other types of output files, such as a listing files, report files, log files, and so forth. For example, a listing file may reiterate the structured input file 106, shows the sequence in which the simulated data 122 for the columns and tables will be generated, show column dependencies, show which data generating sessions 126-1-*b* that will build each table, and so forth. A report file may report the code source 124-1-*a* for each column, report errors in the structured input file 106, report diagnostic or performance information, and provide other feedback information for a user or machine. A log(s) file may provide information about current state of operations for the program builder component 110, the data generator program 120, the application program 140, and so forth.

The program builder component 110 may output the data generator program 120 as a source code version 152 or an executable code version 154 of the data generator program 120. The program builder component 110 generates the data generator program 120 by reading the structured input file 106, and selecting program code modules from one or more code sources 124-1-*a* based on the structured input file 106 in order to produce the functionality provided by the data generator program 120. The program builder component 110 may then write the selected program code modules to the source code version 152 of the data generator program 120.

In various embodiments, a compiler 150 may be communicatively coupled to the program builder component 110. The compiler 150 may be operative to compile a source code version 152 of the data generator program 120 into an executable code version 154 of the data generator program 120. When the source code version 152 is completed, the compiler 150 may compile the source code version 152 of the data generator program 120 into the executable code version 154 of the data generator program 120 ready for execution by a computing device. Additionally or alternatively, the compiler 150 may be integrated with the program builder component 110 to produce as output the executable code version 154 of the data generator program 120. The embodiments are not limited in this context.

A given data generator program 120 produced by the program builder component 110 may be specifically designed to produce a certain type of simulated data 122 for the simulation database 130 as described by the structured input file 106. Some of the main features implemented by the data generator program 120 may include the capability to exploit local and remote computing resources, execute in a different environment than the one in which the structured input file 106 was created, execute unattended, execute as one or more processes on one or more computers, incorporate extant data into the simulation database 130, selectively, with or without modification, among other features.

In one embodiment, the data generator program 120 is a computer program comprising various groups of program code statements (or subprograms) designed to generate the simulated data 122 for columns in tables 132-1-*c* of the simulation database 130. For instance, the data generator program 120 contains groups of program code statements arranged to create multiple data generating sessions 126-1-*b*, assign work to each data generating sessions 126-1-*b*, control execution of each data generating session 126-1-*b*, and synchronizes the data generating sessions 126-1-*b*. The specific work assigned to a data generating session 126-1-*b* can be generating simulated data 122 for a single table, generating simulated data 122 for multiple tables, or generating simulated data 122 for part of a table. When multiple data generating sessions 126-1-*b* are used to build the simulated data 122 for a table, the data generator program 120 contains program code statements that assemble the pieces built by the data generating sessions 126-1-*b* into a single database table. The data generator program 120 further includes program code statements to detect errors that occur during data generation and terminate the data generation process if necessary.

The data generator program 120 produced by the program builder component 110 is designed to run independently from the program builder component 110. This is analogous to the executable file that a linkage editor produces from the object file that a traditional compiler (FORTRAN et al) generates. The data generator program 120, however, is typically not machine language, but rather is a computer program written using a given programming language (e.g., third or fourth generation programming language).

The data generator program 120 comprises a set of subprograms, each designed to execute in one of the data generating sessions 126-1-$b$ for a portion of the processing time. The subprograms are organized so that the most independent tables in the simulation database 130 are built first, the tables that depend on them are built next, and so on until all of the tables are populated. Whenever possible, the program builder component 110 attempts to assign multiple subprograms to execute simultaneously in multiple data generating sessions 126-1-$b$ to save elapsed real-time for the data generator program 120.

Once produced by the program builder component 110, the data generator program 120 may be executed by one or more computing devices to generate the simulated data 122 for the simulation database 130. It is worthy to note that a particular computing device used to execute the data generator program 120 may be the same or different from the computing device used to execute the program builder component 110 used to produce the data generator program 120. The embodiments are not limited in this context.

In some embodiments, the data generator program 120 may be executed by a computing device to generate the simulated data 122 for the simulation database 130 using multiple data generating sessions 126-1-$b$. In some cases, the application program 140 may be a complex application program designed to process and use massive volumes of data typically stored by a DBMS. Populating a simulation database 130 that has hundreds of tables and thousands of columns with the simulated data 122 can take a significant amount of time, on the order of weeks or sometimes even months. To accelerate generation of the simulated data 122, the data generator program 120 may be designed for execution by multiple computing devices and multiple data generating sessions 126-1-$b$.

The one or more computing devices used to execute the data generator program 120 and perform the various data generating sessions 126-1-$b$ may be local or remote from the equipment used to store the simulation database 130 and/or the application program 140. For instance, the data generator program 120 (or versions and threads thereof) may be executed by multiple networked computing devices geographically remote from the simulation database 130 and/or the application program 140, and the data generating sessions 126-1-$b$ may be conducted remotely over a public network (e.g., the Internet) or a private network (e.g., an organization intranet). Additionally or alternatively, the data generator program 120 may be executed locally by one or more computing devices also storing the DBMS software, the simulation database 130 and application program 140. The embodiments are not limited in this context.

In order to exploit the use of multiple data generating sessions 126-1-$b$ to more quickly and efficiently generate the simulated data 122, one or more files from the structured input file 106 used as input to the program builder component 110 contains program code statements that identify and describe a given set of particular data generating sessions 126-1-$b$ in which the simulated data 122 will be generated. For instance, various program code statements for multiple data generating sessions 126-1-$b$ can be selected and written to the data generator program 120 by the program builder component 110. The name of a computer is provided for each data generating session 126-1-$b$. All data generating sessions 126-1-$b$ can run on a single computer, several data generating sessions 126-1-$b$ can run on one computer while other data generating sessions 126-1-$b$ run on another computer, or each data generating session 126-1-$b$ can run on a different computer. As such, multiple computers can be used to generate the simulated data 122, thereby substantially increasing the data generation rate by which the simulated data 122 is generated by the data generator program 120.

In some embodiments, the data generator program 120 may operate in a concurrent or in a sequential manner. In some cases, the data generating sessions 126-1-$b$ may be executed concurrently or in parallel. For instance, the data generator program 120 may generate a first set of simulated data 122-1 for the table 132-1, while substantially simultaneously the data generator program 120 (or another version or thread of the data generator program 120) may generate a second set of simulated data 122-2 for the table 132-2. In other cases, the data generating sessions 126-1-$b$ may be implemented sequentially or in a particular order. For instance, the data generator program 120 may generate a first set of simulated data 122-1 for the table 132-1 at time $t_1$, while the data generator program 120 (or another version or thread of the data generator program 120) may generate a second set of simulated data 122-2 for the table 132-2 at time $t_2$. The embodiments are not limited in this context.

The system 100 may include the application program 140. In various embodiments, the simulated data 122 and the simulation database 130 as defined by the structured input file 106 may be specifically generated for use with a given application program 140. The application program 140 may then use the simulated data 122 and the simulation database 130 in various use scenarios, such as to measure performance of the application program 140 in order to support a business decision whether to deploy the application program 140 for an organization. The application program 140 may comprise, for example, any application program or integrated system of application programs designed to use a database and/or DBMS. In this context, the application program 140 may be considered a database application program. Examples for the application program 140 may include without limitation software products for data entry, retrieval, management, and mining; report writing and graphics; statistical analysis; business planning, forecasting, and decision support; operations research and project management; quality improvement; applications development; data warehousing (extract, transform, load); platform independent and remote computing; as well as others. The software products may be specifically designed for business solutions that enable large scale software solutions for areas such as information technology (IT) management, human resource management, financial management, business intelligence, customer relationship management and more. An example of an application program may include application programs made by SAS Institute Inc. Other application programs from other providers may be used as well. The embodiments are not limited in this context.

Further details regarding the system 100 in general, and the structured input file 106, the program builder component 110, the data generator program 120 in particular, may be described with reference to FIGS. 2-13.

Figure 2:
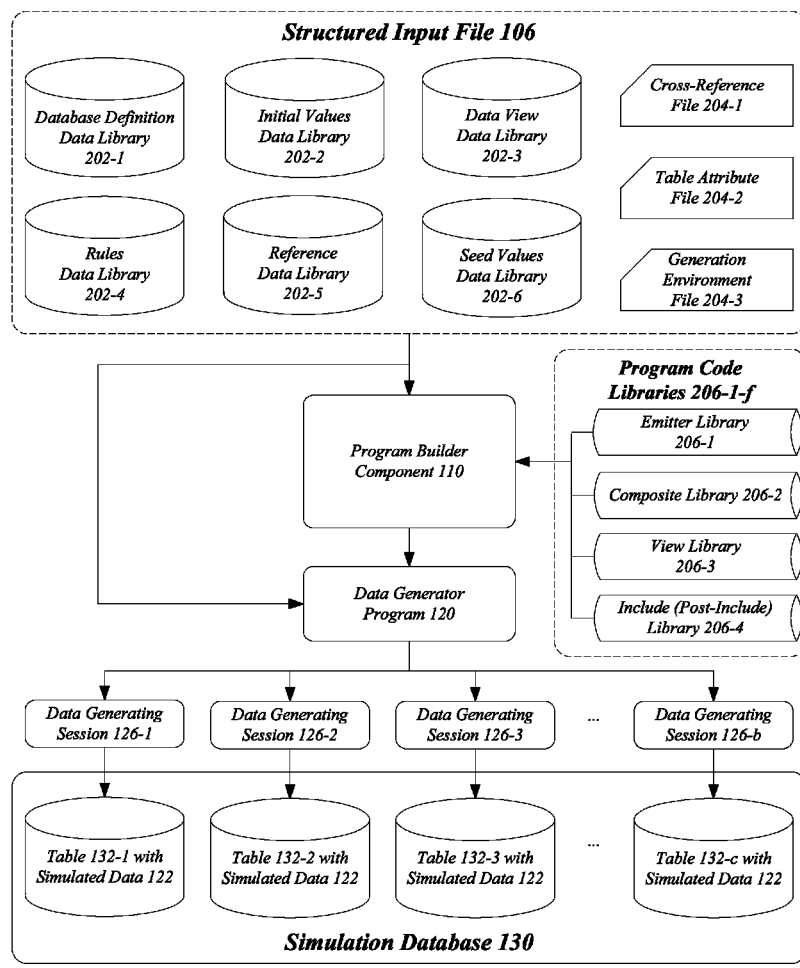
FIG. 2 illustrates an embodiment of a second system.

FIG. 2 illustrates an embodiment of a system 200. The system 200 may illustrate more details for the system 100, particularly for the structured input file 106. The system 200 also introduces a set of program code libraries 206-1-$f$ communicatively coupled to the program builder component 110. The program code libraries 206-1-$f$ may comprise various examples and implementations for the code sources 124-1-$a$, as well as provide other features and functionality for the program builder component 110 and/or the data generator program 120.

As shown in the illustrated embodiment of FIG. 2, the structured input file 106 may comprise different types of input files for the program builder component 110. The simulation database 130 to be generated is described by a schema that can be represented as one or more data libraries 202-1-*d*. A schema is any set of tables that can be accessed by the various library engines. These include without limitation various DBMS, proprietary native format libraries, and extensible markup language (XML) files, among others.

In one embodiment, for example, the structured input file 106 may comprise one or more data libraries 202-1-*d* including without limitation a database definition data library 202-1, an initial values data library 202-2, a data view data library 202-3, a rules data library 202-4, a reference data library 202-5, and seed values data library 202-6. It may be appreciated that the structured input file 106 may include more or fewer data libraries 202-1-*d* as desired for a given implementation.

The data libraries 202-1-*d* may include the database definition data library 202-1. The database definition data library 201-1 may comprise various definitions for data objects of the simulation database 130. For instance, the database definition data library 201-1 may include definitions for various columns of the tables 132-1-*c* of the simulation database 130.

The data libraries 202-1-*d* may include the initial values data library 202-2. The initial values data library 202-2 may include various data files or tables in a database that directly correspond to tables 132-1-*c* in the simulation database 130 for which simulated data 122 is to be generated. Each table in the initial values data library 202-2 may have some or all of the columns that the corresponding table 132-1-*c* of the simulation database 130 will have. A table in the initial values data library 202-2 supplies data values that are passed directly to the corresponding table 132-1-*c* of the simulation database 130 during data generation. When the number of rows in a table in the initial values data library 202-2 does not match the number of rows in the generated table 132-1-*c* of the simulation database 130, the program builder component 110 writes code to the data generator program 120 that duplicates or discards rows from the corresponding table in the initial values data library 202-2, as needed.

The data libraries 202-1-*d* may include the data view data library 202-3. The data view data library 202-3 may include various files that contain program code statements. A view extracts data from one or more other tables internal or external to the simulation database 130 and provides data for one or more columns in a table 132-1-*c* of the simulation database 130. In some cases, a view can return a different number of rows than the table being generated. For instance, if the view returns fewer rows, rows are duplicated as needed to match the number of rows in the table being generated. If a view returns more rows, rows are discarded to match the number of rows in the table being generated. A view also provides a way to copy a group of columns from a parent table to a child table while keeping related values together on each row. The use of views provides a mechanism that goes beyond referential integrity to include columns that are logically associated even though they are not necessarily identified as primary or foreign keys.

The data libraries 202-1-*d* may include the rules data library 202-4. The rules data library 202-4 may contain various files, including one or more of a generation parameters file, a group parameters file, a composite file, and an (op-tional) mapping file. It may be appreciated that the rules data library 202-4 may include more or fewer files as desired for a given implementation.

In various embodiments, the rules data library 202-4 may include a generation parameters file. The generation parameters file specifies how the data for each column is to be generated. This file contains one row for each column in the database that is to be generated. If the optional mapping file is used (paragraph 0069), columns can get their specifications from the map and do not necessarily need to be specified in the generation parameters file. The mapping file and the generation parameters files are complementary. Exemplary columns in this file are shown in Table 1 as follows:

TABLE 1

| Data Type | Content |
| --- | --- |
| Character (text) | Name of the table that contains the column whose data is to be generated. |
| Character (text) | Name of the column whose data is to be generated. |
| Character (text) | The type of the entity that will generate the data for this column (emitter, view, composite, etc.). |
| Character (text) | The name of the entity that will generate data for this column (name of the emitter, name of the view, etc.). |
| Character (flag) | When the data for the column will be generated by a view, this yes/no indicator tells the program builder component 110 whether to include code in the data generator program that adjusts the number of rows in the view's result set to match the number of rows in the table that contains this column. |
| Character (text) | The name of another column (in the same table or a different table) from which the data for this column is derived. |
| Character (text) | If this column is a member of a group, this is the name of the group. |
| Numeric (integer) | If this column is a member of a group, this is the position of the column in the group. |
| Character (varies) | Parameters to the emitter that writes the code to the data generator program that creates the data that will populate this column. |
| Numeric (varies) | Parameters to the emitter that writes the code to the data generator program that creates the data that will populate this column. |

In various embodiments, the rules data library 202-4 may include a group parameters file. The group parameters file provides information to the program builder component 110 to write code to the data generator program 120 that is to execute before or after (or both) the data for a group of columns is generated. Exemplary columns in this file are shown in Table 2 as follows:

TABLE 2

| Data Type | Content |
| --- | --- |
| Character (text) | Name of the table that contains the columns that are in this group. |
| Character (text) | Name of the group. |
| Character (text) | Name of the file that is executed by the program builder component 110 to write code to the data generator program that executes before or after (or both) the data for the columns in the group is generated. |
| Numeric (flag) | Whether the columns in the group are denormalized; in other words, whether the columns in the group have the same values on several rows of the generated table. |
| Character (varies) | Parameters to the wrapper library 206-3 that writes the code to the data generator program 120 that will execute before or after the data for the columns in the group is generated. |
| Numeric (varies) | Parameters to the wrapper library 206-3 that writes the code to the data generator program that will execute before or after the data for the columns in the group is generated. |

In various embodiments, the rules data library 202-4 may include a composite file. A "composite" is a source of data for a column that consists of more than one emitter, view, program code file, or other source. There are different types of composites, but they are all described to the program builder component 110 by the composite file. The type of a composite is specified in the generation parameters file with the information for the column whose data is generated by the composite. Each row of the composite file describes one operation of one composite. Exemplary columns in this file are shown in Table 3 as follows:

TABLE 3

| Data Type | Content |
| --- | --- |
| Character (text) | The name of the composite. |
| Numeric (integer) | The number of steps in the composite. |
| Numeric (integer) | The sequential number of this step in the composite. |
| Character (text) | An expression that is specific to the composite's type. This is a logical expression for a "conditional" composite, a numeric value between zero and one for a "proportional" composite, a mathematical operator for an "expression" composite, or blank for a "series" composite. |
| Character (text) | The type of the source that will generate the data in this step of the composite (emitter, view, etc.). |
| Character (text) | The name of the source that will generate the data in this step of the composite (name of the emitter, name of the view, etc.). |
| Character (text) | The name of another column (in the same table or a different table) from which the data generated by this step of the composite is derived. |
| Character (varies) | Parameters to the source that will generate the code that will generate the data in this step of the composite (emitter, view, etc.). |
| Numeric (varies) | Parameters to the source that will generate the code that will generate the data in this step of the composite (emitter, view, etc.). |

In various embodiments, the rules data library 202-4 may include an optional mapping file. The mapping file can be used when there are data rules that apply to columns that have one or more common characteristics. The columns with the common characteristics can be in the same table or in different tables. The mapping file specifies the relevant program code libraries 206-11 (e.g., emitter, view, etc.) and the parameters that tell the program builder component 110 how to write program code to the data generator program 120 for those columns.

The data libraries 202-1-d may include the reference data library 202-5. The reference data library 202-5 may include one or more references, code, programs or definitions used to build the data generator program 120.

In various embodiments, the structured input file 106 comprises one or more directive files 204-1-e including without limitation a cross-reference file 204-1, a table attributes file 204-2 and a generation environment file 204-3. It may be appreciated that the structured input file 106 may include more or less directive files as desired for a given implementation.

The directive files 204-1-e may include the cross-reference file 204-1. The cross-reference file 204-1 can be used to specify parent-child relationships between columns and tables 132-1-c instead of, or in addition to, key relationships in the input database. Each row of this table relates one parent column to one child column. Exemplary columns in this file are shown in Table 4 as follows:

TABLE 4

| Data Type | Content |
| --- | --- |
| Character (text) | The name of a table that has one or more primary keys. Such a table is often called a "parent" table. |
| Character (text) | The name of a column in the parent table. |
| Character (text) | The name of a column in the child table. |
| Character (text) | The name of a table that has one or more foreign keys. Such a table is often called a "child" table. |

Keys can be simple (consisting of one column) or composite (consisting of two or more columns). For a simple key, one row of this table relates a primary key to a foreign key. For a composite key, the parent and child table names are repeated as the columns that form the key in each table are listed on successive rows of the cross reference file. Each primary key can be the parent of one or more foreign keys.

The directive files 204-1-e may include the table attributes file 204-2. In some embodiments, the table attributes file 204-2 may be generally sub-divided into a column descriptions file and a table descriptions file.

The column descriptions file identifies how simulated data 122 is to be generated for columns in the simulation database 130. This file may include none, some, or all of the columns in the simulation database 130. For each column, a pre-packaged or custom data generation algorithm (with parameters) may be specified. A column may optionally be identified as a dependent of another column in the same table or another table. Columns may be placed in groups to control the order of generation.

The table descriptions file identifies the number of rows to be generated for each table 132-1-c and whether that number is fixed or proportional. Tables 132-1-c with "absolute" numbers of rows have exactly that many rows in the generated simulation database 130. Tables 132-1-c with "relative" numbers of rows are scaled to achieve a specified total database size.

The table attributes file 204-2 may contain one row for each table in the simulation database 130. It is worthy to note that every table in the data base does not need to appear in the table attributes file, because every table attribute typically has a default value. The default number of observations for the tables is specified in the generation environment file. Each row gives the program builder component 110 information about the table. The columns in the table attributes file 204-2 may be illustrated in Table 5 as follows:

TABLE 5

| Data Type | Content |
| --- | --- |
| Character (text) | The name of the table. |
| Character (flag) | The type of the table. This tells the program builder component 110 whether the number of rows in the table (see next column description) is fixed or proportional. When a table has a fixed number of rows, it always has that number of rows regardless of the size of the generated simulation database 130. When a table has a proportional number of rows, its size is adjusted to create a database of the size specified in the generation environment file 204-3. |
| Numeric (integer) | Number of rows the table is to contain in the generated simulation database 130. See previous column description for how this value is interpreted by the program builder component 110. |
| Numeric (integer) | The generation technique that is to be used to generate the data for the table. This tells the program builder component 110 whether the data for the table can be generated in a single step, by multiple data generating sessions 126-1-b each of which |

TABLE 5-continued

| Data Type | Content |
|---|---|
| | generates a portion of the rows in the table, or by replication with selective modification of rows. |
| Numeric (integer) | The identification number of the data generating session 126-1-b that is to generate the data for this table or do the "final assembly" of the data for this table. This is optional and is used only in specific situations. |
| Character (flag) | This specifies whether the "post-process" file (see next column description) executes after each subset of the rows in the table, or after final assembly of the table is complete. |
| Character (text) | Name of a file that contains program code that is to be executed after the simulated data 122 has been generated for the table. This is optional and is used only in specific situations. |

In general, the simulation database 130 is described by either a set of empty tables 132-1-c (containing columns but no rows) or a populated database that is similar or identical to the one to be generated. The database description tells the program builder component 110 the name of each table 132-1-c; the name, type, and width of each column; and primary key-foreign key relationships between tables 132-1-c.

The directive files 204-1-e may include the generation environment file 204-3. In general, the generation environment file 204-3 describes the environment in which program generation and data generation will take place. The generation environment file 204-3 identifies the available computer(s) and provides for running multiple data generating sessions 126-1-b on each computer. Records in this file specify how much space is available for each session, names of files, and other environmental information.

In one embodiment, for example, the generation environment file 204-3 may contain environmental information including without limitation a desired size of the populated simulation database 130, a default number of rows in a table 132-1-c, a number of data generating sessions 126-1-b, a name of the computer on which each data generating sessions 126-1-b will run, login information to create a data generating session 126-1-b, an amount of disk space available to a data generating session 126-1-b, names of files and directories that will be used by a data generating session 126-1-b, and options that govern resource usage and performance for a data generating session 126-1-b. One or more data generating session 126-1-b may be run on each computer, and multiple computers may be used. The generation environment file 204-3 may further comprise names of libraries and files used by the program builder component 110 and the data generator program 120, and locations of relevant program code libraries 202-1-d.

Some columns require no data or very simple data, some columns require data that can be generated by machine-written program code statements, and some columns require data that can only be generated by a complex custom program. The program builder component 110 solves this extensibility problem using a "plug-in" architecture. More particularly, the program builder component 110 may allow a user to "plug in" modules that produce the program code statements that are written to the data generator program 120. This may be accomplished using one or more of the program code libraries 206-1-f. As a result, the program builder component 110 and the data generator program 120 are flexible and robust and can be modified and extended to provide functionality for various application programs 140 with more complex data requirements.

In various embodiments, the program builder component 110 is operative to build the data generator program 120 using one or more program code libraries 206-1-f. Examples of program code libraries include an emitter library 206-1, a composite library 206-2, a wrapper library 206-3, an include library 206-3, and a post-include library 206-4. It may be appreciated that a given implementation for the structured input file 106 may include more or fewer program code libraries as desired for a given application program 140.

The program code libraries 206-1-f may include the emitter library 206-1. Emitters are files that contain program code. They are executed by the program builder component 110 and write program code to the data generator program 120. The program code in an emitter has access to the name, type, length, and other information about the column for which simulated data 122 is to be generated. An emitter can read parameters that describe the simulated data 122 the column is to contain, and use that information to write different programming statements to the data generator program 120 depending on the specific data generation requirements of the column.

In one embodiment, an emitter is a series of programming language statements (e.g., third or fourth generation programming language) that are executed in a data operation. An emitter is typically not a complete data operation. An emitter accepts parameters that control the statements that it writes to the data generator program 120, and that supply literal values to write to the data generator program 120. An emitter shares some characteristics with a macro (e.g., has a name, accepts parameters, generates statements), but while the purpose of a macro is string substitution, one purpose of an emitter is producing a block of statements for the data generator program 120, which normally involves significantly more than string substitution.

The program code libraries 206-1-f may include the composite library 206-2. A composite is a way to specify that the data for a column is generated by the statements produced by only one or more emitters. Which emitter's statements are executed depends on the values of one or more columns whose data for the row has already been generated. There are at least four types of composites, including conditional composites, proportional composites, series composites, and expression composites.

The program code libraries 206-1-f may include the include library 206-3. An "include" is a file of proprietary or conventional program code statements that are executed in the data generator program 120 via a % INCLUDE statement. This is a way of supplying statements to the data generator program 120 that are too difficult to generate in an emitter or encapsulate in a view. As such, the use of includes provide a way to create arbitrarily complex blocks of data-generating program code statements.

The program code libraries 206-1-f may include the post-include library 206-4. A "post-include" file may contain one or more complete program steps. The program builder component 110 accepts a directive to generate a % INCLUDE statement after the simulated data 122 for a table 132-1-c is generated, or at the end of each slice when multiple data generating sessions 126-1-b are used to generate simulated data 122 for a single table 132-1-c. This provides a way to "post-process" the data in a table 132-1-c or use a completed table 132-1-c as the source for adjustments to one or more other tables 132-1-c in the simulation database 130.

In many cases, some of the simulated data 122 to be generated for the simulation database 130 already exists in some form. The program builder component 110 provides at least four ways to import extant data and take full advantage of the imported extant data, including use of the initial values data library 202-2, the data view data library 202-3, the seed values data library 202-6, and direct access through program code generated by an emitter from the emitter library 206-1.

In a first way to import extant data, the program builder component 110 reads metadata of the initial values data library 202-2 having data sets (data files or tables in a database) that directly correspond to tables 132-1-c in the simulation database 130 for which simulated data 122 is to be generated. Each table in the initial values data library 202-2 may have some or all of the columns that the corresponding table 132-1-c of the simulation database 130 will have. A table in the initial values data library 202-2 supplies data values that are passed directly to the corresponding table 132-1-c of the simulation database 130 during data generation. When the number of rows in a table in the initial values data library 202-2 does not match the number of rows in the generated table 132-1-c of the simulation database 130, the program builder component 110 writes code to the data generator program 120 that duplicates or discards rows from the corresponding table in the initial values data library 202-2, as needed.

In a second way to import extant data, a view can read from a wide variety of sources including but not limited to views in the data view data library 202-3 (a view can read from another view), tables in the reference data library 202-5, tables 132-1-c in the simulation data base 130, and any other data libraries. Above, using a view to read from one or more other tables 132-1-c in the simulation database 130 was offered as a way to maintain the integrity of a group of columns across each row. However, a view can also be used to read from data sources 202-3, 202-5, and other data libraries that are external to the simulation database 130 whose simulated data 122 is being generated. Such a view may pass data directly through, or it may summarize, subset, or rearrange the data. Views can read from other views, so a "pipeline" can be created between the code source 124-1-a and the generated simulated data 122. The program builder component 110 writes statements to the data generator program 120 that compare the number of rows returned by a view to the number of rows in the table 132-1-c being generated. Rows from the view are duplicated or discarded as needed.

In a third way to import extant data, an emitter may generate statement(s), or an include file may contain statement(s), that reads from a data set (e.g., a data file or a database table) while generating the data for a table 132-1-c in the simulation database 130. The source data set can be accessed randomly, or the source data set may be read into one or more arrays that are then accessed while generating the simulated data 122.

In a fourth way to import extant data, the program builder component 110 reads metadata of the seed values data library 202-6 having data sets (data files or tables in a database) that directly correspond to tables 132-1-c in the simulation database 130 for which simulated data 122 is to be generated. Each table in the seed values data library 202-6 has fewer rows, but all of the columns that the corresponding table 132-1-c of the simulation database 130 will have. A table in the seed values data library 202-6 supplies data values that are passed directly to the corresponding table 132-1-c of the simulation database 130 during data generation. Rows are copied without change from each table in the seed values library to positions distributed throughout the corresponding table 132-1-c of the simulation data base.

Using one or more of the three ways described above, extant data can optionally be included in the generated simulation database 130 with or without modification. By way of example, files in the seed values library contain fully-formed rows that are inserted occasionally into the corresponding table as the simulated data 122 for the table is generated. These files can be used to ensure that the table in the generated simulation database 130 contains some rows that have a prepackaged or controlled combination of values. In another example, files in the initial values data library 202-2 contain some, but usually not all of the columns on the corresponding table in the simulation database 130. These files can be used to supply values that are modified or replicated as the simulated data 122 for a table 132-1-c is generated.

In addition to providing program code to the program builder component 110 through the various program data libraries 206-1-e, embodiments also may provide users a mechanism to supply their own code generators and programming statements, thereby providing a high-level of customization for the data generator program 120. In this manner, a user can optionally supply program code to be executed during data generation. For example, a library containing one or more views provides a way to supply program code that generates the values for a column from other tables in the simulation database 130 or simulated data 122 stored in files in the reference data library 202-5 or other data libraries that are not part of the simulation database 130. Zero or more files that contain program code that is executed by the program builder component 110 to write code to the data generator program 120 that will execute before or after (or both) the data for a group of columns is generated. In another example, a set of program snippet files provides a way to supply program code that is to be executed "in line" in the program operation that generates simulated data 122 for a table 132-1-c of the simulation database 130.

An example for the systems 100, 200 may be provided with reference to FIGS. 3-9. This example starts with a simple data schema and provides examples for the structured input file 106 and its various files to support the data schema, through operations for the program builder component 110, execution of the data generator program 120, and finally construction of the simulation database 130.

Figure 3:
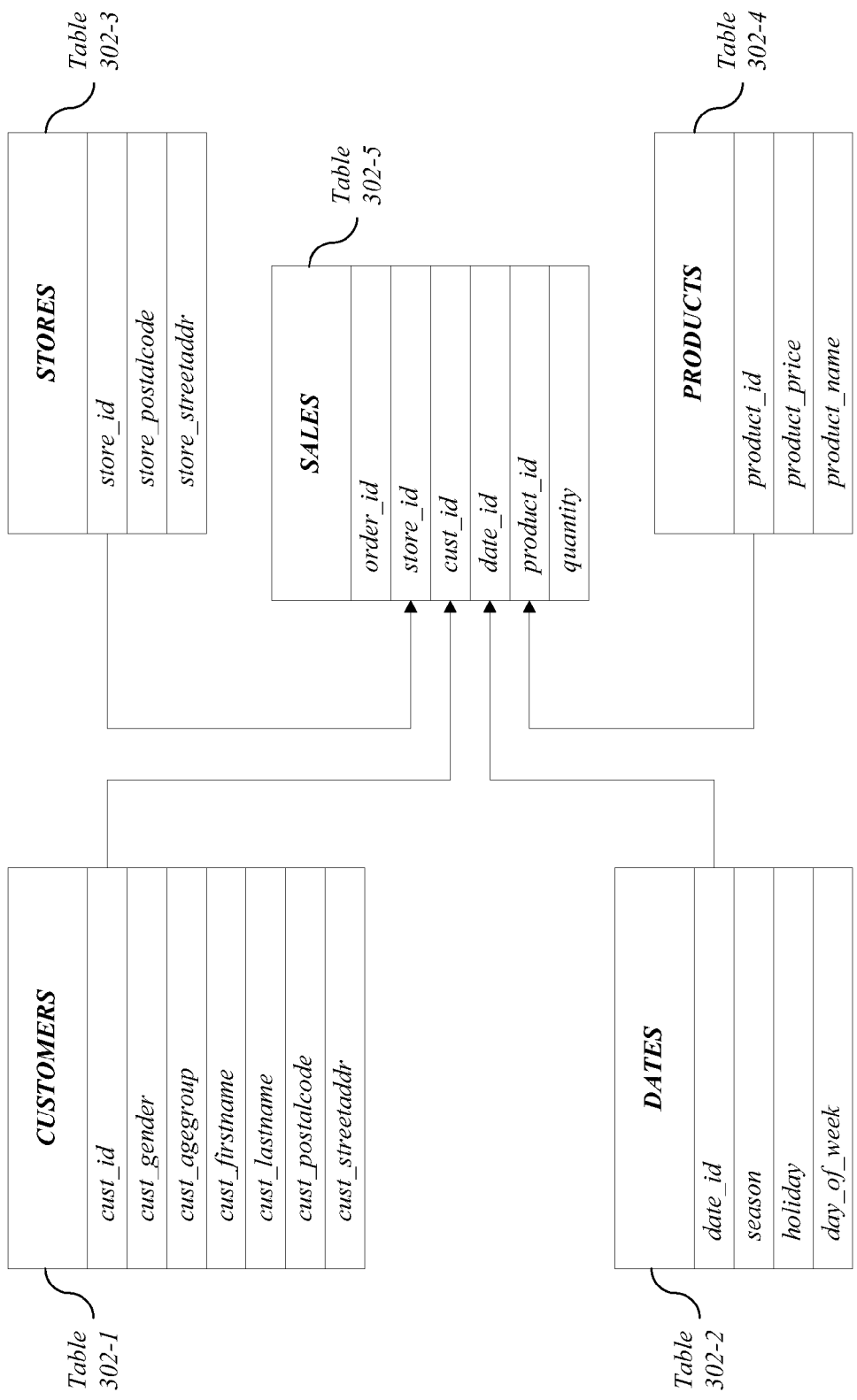
FIG. 3 illustrates an embodiment of a data schema.

FIG. 3 illustrates an embodiment of a data schema 300. The data schema 300 illustrates a schema for an exemplary database. The data schema 300 is provided in a simplified form to allow focus on operations for building the simulation database 130. In the illustrated embodiment shown in FIG. 3, the data schema 300 is a star schema, with five tables 302-1 to 302-5, including a CUSTOMERS table 302-1, a DATES table 302-2, a PRODUCTS table 302-3, a SALES table 302-4, and a STORES table 302-5. Tables 302-1, 302-2, 302-3 and 302-5 are dimension tables, while table 302-4 is a fact table.

The structured input file 106 for the database described by the data schema 300 may contain, for example, tables that were created from program code as follows:

```
create table ddsdata.customers
    (       cust_id                 numeric,
            cust_gender             character(1),
            cust_agegroup           character(1),
            cust_firstname          character(32),
            cust_lastname           character(32),
            cust_postalcode         character(16),
            cust_streetaddr         character(64) );
create table ddsdata.stores
    (       store_id                numeric,
            store_postalcode        character(16),
            store_streetaddr        character(64) );
create table ddsdata.products
    (       product_id              numeric,
            product_price           numeric,
            product_name            character(80) );
```

-continued

```
create table ddsdata.dates
(       date_id         numeric,
        season          character(1),
        holiday         character(1),
        day_of_week     numeric );
create table ddsdata.sales
(       order_id        numeric,
        cust_id         numeric,
        store_id        numeric,
        product_id      numeric,
        date_id         numeric,
        quantity        numeric );
```

FIG. 4 illustrates an embodiment of an initial values data library 202-2. The initial values data library 202-2 contains only one file in this example, which is shown as table 402. The table 402 provides initial values for the STORES table 302-5 in the simulation database 130. The table 402 includes a Store Identifier (ID), Street Address and Postal Code for four (1-4) stores. This example assumes the STORES table 302-5 is populated completely from the initial values provided by the table 402.

FIG. 5 illustrates an embodiment of a data view data library 202-3. The data view data library 202-3 for this example contains one view 502. View 502 is written in a fourth-generation programming language that supports procedural as well as query operations. This adjusts the proportions of the date identifiers in the SALES table 302-4 in the simulation database 130 so that most sales are made on weekend days, the fewest sales are made early in the week, and an intermediate number of sales are made in the middle of the week.

The view 502 illustrates an optional feature to automatically size the result set produced by a view. The program builder component 110 will write program code statements to the data generator program 120 that will execute after the view 502 has executed and produced its result set. The program code statements written by the program builder component 110 will compare the size of the result set to the number of rows specified to be created in the SALES table 302-4. If the result set is too big, the program code statements written by the program builder component 110 will delete enough rows distributed throughout the result set to make the sizes match. If the result set is not large enough, the program code statements written by the program builder component 110 will duplicate rows distributed through the result set so the result set has enough rows to populate the Sales table 302-4.

When a view is programmed to create exactly the number of rows in its result set that will be required by the table populated by the result set, generation of this "automatic sizing" code can be disabled. This is controlled by a field in the generation parameters file in the rules data library 202-4.

FIGS. 6A-6F illustrate various files for an exemplary rules data library 202-4. In this example, the rules data library 202-4 may include at least two input files, including a generation parameters file and a composites information file. Each of FIGS. 6A-6D illustrate one or more tables 602-1-j from the generation parameters file. For example, the tables 602-1 to 602-4 roughly correspond to respective tables 302-1 to 302-4 of the data schema 300. Each of tables 602-1-j has multiple columns 604-1-k. Various subsets of columns 604-1-k for the tables 602-1-j may be shown in FIGS. 6A-6D for purposes of clarity. Each of FIGS. 6E, 6F illustrate a table 610 from the composites information file. The table 610 has multiple columns 612-1-m. As with the FIGS. 6A-6D, various subsets of columns 612-1-m may be shown in FIGS. 6E, 6F for purposes of clarity.

FIG. 6A illustrates a partial embodiment of the column specifications table in the rules data library 202-4. In the illustrated embodiment shown in FIG. 6A, a set of rules based on the information provided by tables 602-1 to 602-4 may be constructed and used to generate various columns for the respective tables 302-1 to 302-4 of the data schema 300. It is worthy to note that the STORES table 302-5 is populated completely from the initial values provided by the table 402 in the initial values data library 202-2, as described with reference to FIG. 4, and therefore does not have column specifications in the rules data library 202-4 in this example.

Each of the tables 602-1 to 602-4 has a corresponding source 124-1-a for each column. As previously described, the source 124-1-a might be a primary key column in another table, or a view that materializes values for the column from one or more data sources 202-3, 202-5, or 130, program code statements written to the data generator program 120 by the program builder component 110, or other types of sources. The source 124-1-a may be identified using columns 604-1, 604-2. The column 604-1 provides a type of code or data source, while the column 604-2 provides a name for the code source. Examples for types of code sources as listed in column 604-1 may include "emitter," "conditional," "view" and so forth. Examples for names of code sources as listed in column 604-2 may include sas_1_date_rg, d_h, sas_1_counter, gen_date_ids, and so forth.

It is worthy to note that in this example the simulation database 130 contains five columns whose code sources 124-1-a are not specified in the generation parameters file, as follows:

The CUST_ID and PRODUCT_ID columns in the SALES table 302-4 are foreign keys. The program builder component 110 generates code to populate those columns as it builds the data generator program 120.

Foreign keys can be identified to the program builder component 110 in the cross-reference file 204-1 or via constraints in the database definition data library 202-1 or via column specifications in the rules data library 202-4.

The STORE_ID, STORE_STREETADDR and STORE_POSTALCODE columns in the STORES table 302-5 are read directly from a file in the initial values data library 202-2. That file has the same name (STORES) as the table 132-1-c of the simulation database 130 table it populates, and its columns have the same names as the columns in the STORES table 302-5.

The program builder component 110 recognizes these kinds of code sources 124-1-a by encountering appropriately named tables and columns in the initial values data library 202-2. Usually, all columns of a table are not supplied by a file in the initial values data library 202-2.

In operation, the program builder component 110 reads the generation parameters file in the rules data library 202-4 as one of the input files within the structured input file 106. When the program builder component 110 reads that the code source 124-1-a specified for the PRODUCT ID column in the PRODUCTS table 602-3 has a code source type "emitter" in the column 604-1, the program builder component 110 locates a file in the emitters library 206-1 with an identical code source name given by the column 604-2 in the PRODUCTS table 602-3. In this case, the program builder component 110 will search for a file named "sas_1_counter" in the emitters library 206-1. The program builder component 110 will then execute the emitter sas_1_counter file to write program code statements to the data generator program 120 that will create values for the PRODUCT_ID column of the PRODUCTS table when the data generator program 120 executes. When the program builder component 110 reads further in the generation parameters file and finds that the code source 124-1-*a* specified for the QUANTITY column in the SALES table 602-4 has the code source type "emitter" in the column 604-1, and the column 604-2 in the SALES table 602-4 has the code source name "sas_1_range," the program builder component 110 will look for a file named "sas_1_range" in the emitter library 206-1. The program builder component 110 will execute the sas_1_range emitter file to write program code statements to the data generator program 120 that will create values for the QUANTITY column in the SALES table when the data generator program 120 executes.

FIG. 6B illustrates a partial embodiment of the column specifications table in the rules data library 202-4. FIG. 6B illustrates columns 604-2, 604-3, 604-4 and 604-5 for the table 602-1 of the exemplary generation parameters file of the rules data library 202-4. Some of these columns can be used (optionally) to control the order in which the simulated data 122 for columns in the simulation database 130 are generated. The column 604-3 lists another column, if any, that is referenced in the process of generating the simulated data 122 for the column. The column 604-4 lists a group, if any, to which the column is assigned. The column 604-5 lists a position in the group, if assigned, for the column.

The table 602-1 shows that column CUST_FIRSTNAME (in the CUSTOMERS table of the simulation database 130) references column CUST_GENDER (also in the CUSTOMERS table of the simulation database 130) as indicated by column 604-3 of the table 602-1. This means that the code source name "c_fn" uses the value in column CUST_GENDER to create values for CUST_FIRSTNAME. The particular way in which the value in a reference column provided in column 604-3 is used is specific to the code source 124-1-*a*. In this case, for example, the code source name "c_fn" is of a code source type "conditional" and that conditional tests the value in CUST_GENDER to see whether it should use a table of female first names or a table of male first names to select a value to assign to CUST_FIRSTNAME.

The table 602-1 also shows that column CUST_STREETADDR references column CUST_POSTALCODE in the column 604-3 of the table 602-1. In this case, the code source name "sas_3_include" writes program code statements to the data generator program 120 that uses the value of CUST_POSTALCODE to select the range of rows in a table from which a street address can eventually be materialized.

The program builder component 110 uses the value in the reference column 604-3 as information indicating that it should write the program code statements to the data generator program 120 that generates values for the referenced column before it writes the program code to the data generator program 120 that generates values for the column that uses the value in the referenced column. The program builder component 110 is typically unaware of how a code source 124-1-*a* uses the value of a reference column.

The columns CUST_POSTALCODE, CUST_GENDER, and CUST_AGEGROUP are all members of the group named "grp_1" as indicated by column 604-4 of the table 602-1. In that group, CUST_POSTALCODE has position 1, CUST_GENDER has position 2, and CUST_AGEGROUP has position 3, as indicated by the column 604-5 of the table 602-1. This information tells the program builder component 110 that when the program code statements to generate data for the columns in the CUSTOMERS table is written to the data generator program 120, the program code statements to generate data for column CUST_POSTALCODE should be written before the program code statements to generate data for column CUST_GENDER, and the program code statements to generate data for CUST_GENDER should be written before the program code statements to generate data for CUST_AGEGROUP.

Placing columns in a particular group does not necessarily give the program builder component 110 any information beyond the order in which the program code that generates values for the columns should be written to the data generator program 120. Certain columns can be combined into groups for any number of reasons, and usually it is because columns in higher-numbered positions use data in columns that are in lower-numbered positions. For complex relationships between columns, this is easier for the user than maintaining a chain of reference columns. Also, this provides a way to ensure that the program code to generate values for a column can use reference values in two or more columns that have lower-numbered positions in the group.

A table of the simulation database 130 can have more than one group of columns, though each column is usually not in more than one group. When this is the case, the groups are generated in alphabetical order by group name. For example, the columns in all positions of the group named "grp_1" are generated, followed by the columns in all positions of the group named "grp_2," and so on.

FIG. 6C illustrates a partial embodiment of the column specifications table in the rules data library 202-4. FIG. 6C illustrates columns 604-2, 604-6, 604-7 and 604-8 for the tables 602-2, 602-3 and 602-4 of the exemplary generation parameters file of the rules data library 202-4. Some of these columns can be used (optionally) to pass arguments that code sources 124-1-*a* can use as they write program code statements to the data generator program 120.

The columns 604-6, 604-7 and 604-8 provide respective numeric parameters 1, 2 and 3. For example, the code source name "sas_1_date_rg" indicated in column 604-2 can use the numeric values 17,532 and 17,897 as indicated in respective columns 604-6 and 604-7 to write the program code statements that will create values for column DATE_ID in table DATES of the simulation database 130 when the data generator program 120 executes. Likewise, the code source name "sas_1_prob_dist" indicated in column 604-2 can use the values 0, 100, and 2 as indicated in respective columns 604-6, 604-7 and 604-8 as it writes program code statements to the data generator program 120 that will generate values for column PRODUCT_PRICE in the PRODUCTS table of the simulation database 130.

FIG. 6D illustrates a partial embodiment of the column specifications table in the rules data library 202-4. FIG. 6D illustrates columns 604-2, 604-9, 604-10 and 604-11 for the tables 602-1, 602-2, 602-3 and 602-4 of the exemplary generation parameters file of the rules data library 202-4. Some of these columns can be used (optionally) to pass numeric and character arguments.

Numeric and character arguments are passed to code sources 124-1-*a* via different columns of the generation parameters file. FIG. 6D shows some of the character arguments in the generation parameters file for this example. For instance, the code source name "sas_3_key_scan" as indicated by column 604-2 can use the values "reflib.ks_zip_sex_2_age" and "keyscan" as indicated by respective columns 604-9, 604-10 as it generates values for the CUST_AGEGROUP column of the CUSTOMERS table of the simulation database 130. The code source name "sas_2_pref_ref_cnt" as indicated by column 604-2 can use the values "Product," "Z6," and "C_N" as indicated by respective columns 604-9, 604-10 and 604-11 to generate the program code that will generate values for column PRODUCT_NAME of the PRODUCTS table of the simulation database 130.

FIG. 6E illustrates a partial embodiment of the composite specifications table in the rules data library 202-4. FIG. 6E illustrates a table 610 for an exemplary composites information file in the rules data library 202-4. The table 610 may include multiple columns 612-1-*m*. For example, the table 610 as shown in FIG. 6E includes columns 612-1 to 612-6.

The composites information file describes operations for each composite source. In the illustrated embodiment shown in FIG. 6E, every composite has a composite name as indicated by column 612-1, and one or more operations. Each operation of a composite has a position within the composite, a source type, and a source name as indicated by respective columns 612-2, 612-3 and 612-4. The composite name and position provided by respective columns 612-1, 612-2 form a unique key that identifies each row of the composites information file.

The table 610 shows three composite names for this example, including "c_fn," "d_h" and "d_s." The "c_fn" composite has two operations, and the "d_h" and "d_s" composites each have six operations.

It can be seen that both operations of composite "c_fn" use the same code source 124-1-*a* as indicated by columns 612-3, 612-4 as code source type "emitter" and code source name "sas_3_list_select." However, the "d_h" and "d_s" composites each use two different code sources 124-1-*a*. Both code sources used by the "d_h" and "d_s" composites are of type "emitter" as indicated by column 612-3, but one of the code sources has name "sas_3_constant" while the other code source has name "sas_3_missing" as indicated in column 612-4.

The table 610 also shows character parameter values 1, 2 that are passed to the code sources 124-1-*a* in columns 612-5, 612-6. Since a composite has more than one code source 124-1-*a* (e.g., composites "d_h and "d_s") or a code source 124-1-*a* that is used in more than one way (e.g., composite "c_fn"), each operation must be able to pass operation-specific parameters to the code source 124-1-*a* for a given operation.

FIG. 6F illustrates a partial embodiment of the composites specification table in the rules data library 202-4. FIG. 6F illustrates the table 610 for the exemplary composites information file in the rules data library 202-4. The table 610 may include multiple columns 612-1-*m*. For example, the table 610 as shown in FIG. 6F includes columns 612-1, 612-2 and 612-7.

The column 612-7 of the table 610 indicates a conditional expression that is evaluated during data generation by the program code generated by a "conditional" type of composite source in the composites library 206-2. While there are four types of composite sources (e.g., conditional, proportional, series, and expression), the example provided by table 610 uses only conditional composites. A conditional composite writes program code statements to the data generator program 120 that tests the logical condition specified for each operation, followed by the program code statements written by the code source 124-1-*a* for the operation. The logical conditions are executed so that operations are mutually exclusive, that is, the data for the column is generated by the program code statements that were written to the data generator program 120 by only one code source 124-1-*a*.

Schematically, the program code statements written to the data generator program 120 by the program builder component 110 would appear for column CUST_FIRSTNAME in the CUSTOMERS table, as follows:

```
if      (     cust_gender eq 'M' )
        {     program code generated by emitter sas_3_list_select
              using parameters "reblib.n_fn" and "FirstName" }
else
        {     program code generated by emitter sas_3_list_select
              Using parameters "reblib.n_ff" and "FirstName" }
```

Data for column HOLIDAY in the DATES table is generated by composite "d_h." Schematically, the program code statements written to the data generator program 120 by the program builder component 110 from the composite "d_h" would appear as follows:

```
if      (     '26may2008'd eq date_id )
        {     program code generated by emitter sas_3_constant
              using parameters "1" and "ASSIGN" }
else if ( '04jul2008'd eq date_id )
        {     program code generated by emitter sas_3_constant
              Using parameters "1" and "ASSIGN" }
else if ( '01sep2008'd eq date_id )
        {     program code generated by emitter sas_3_constant
              Using parameters "1" and "ASSIGN" }
else if ( '27nov2008'd eq date_id )
        {     program code generated by emitter sas_3_constant
              Using parameters "1" and "ASSIGN" }
else if ( '25dec2008'd eq date_id )
        {     program code generated by emitter sas_3_constant
              Using parameters "1" and "ASSIGN" }
else
        {     program code generated by emitter sas_3_missing
              Using parameters "1" and "ASSIGN" }
```

While this example does not use the other types of composites, listed below are various schematic representations of the various program code statements they write to the data generator program 120.

A "series" composite directs the program builder component 110 to invoke the code source 124-1-*a* for each operation of the composite, in sequence. The schematic representation for this is as follows:

```
{ program code generated by the source for step 1 }
{ program code generated by the source for step 2 }
...
{ program code generated by the source for the last step }
```

A "proportional" composite directs the program builder component 110 to write program code statements to the data generator program 120 that generates a random value on a uniform distribution between zero and one, and then executes the operation of the composite whose specified range includes the random value. The schematic representation for this is as follows:

```
{ generate a random value between zero and one }
if      { the random number is in the range specified for step 1 }
        { program code generated by the source for step 1 }
else
if      { the random number is in the range specified for step 2 }
        { program code generated by the source for step 2 }
...
else {the random number is not in any of the previous ranges}
        { program code generated by the source for the last step }
```

An "expression" composite directs the program builder component 110 to write program code statements to the data generator program 120 that executes the program code statements generated by the code source 124-1-*a* for each operation, using the operator specified in the conjunction for the operation to apply the result produced by the program code statements generated by the operation's code source 124-1-*a* to the result produced by the program code statements that was generated by the subsequent operation's code source 124-1-*a*. The schematic representation for this is as follows:

```
{ program code generated by the source for step 1 }
{ save result in a temporary variable }
{ program code generated by the source for step 2 }
temporary variable = temporary variable {operator specified in
conjunction of step 1} {result produced by program code generated by
the source for step 2}
...
{ program code generated by the source for the last step }
{destination column} = temporary variable {operator specified in
conjunction of the final step} {result produced by program code
generated by the source for the previous step}
```

FIG. 7 illustrates an embodiment of a cross-reference file 204-1. In the illustrated embodiment shown in FIG. 7, the cross-reference file 204-1 includes a table 702 having various columns 704-1-*n*. For example, the table 702 may include columns 704-1, 704-2, 704-3 and 704-4 indicating a respective primary key table name, primary key column name, foreign key column name, and foreign key table name.

In some cases, it may be more efficient to explicitly specify the relationships between the primary and foreign keys in the simulation database 130 in the database definition data library 202-1 or the rules data library 202-4. Other times, it may be more efficient to create a cross-reference file 204-1. The cross-reference file 204-1 specifies the parent-child references between the tables 132-1-*c* in the simulation database 130. This example is for a very small database, and uses the cross-reference file 204-1.

The cross-reference file 204-1 for this example shows that the CUSTOMERS table has a single-column primary key "CUST_ID," the PRODUCTS table has a single-column primary key "PRODUCT_ID," and the SALES table has two single-column foreign keys "CUST_ID" and "PRODUCT_ID." Each corresponds to the primary key whose column has the same name.

FIG. 8 illustrates an embodiment of a table attributes file 204-2. In the illustrated embodiment shown in FIG. 8, the table attributes file 204-2 includes a table 802 having various columns 804-1-*o*. For example, the table 802 may include columns 804-1, 804-2 and 804-3 indicating a respective table name, table type and number of rows. It may be appreciated that the table attributes file 204-2 may include additional columns as previously described.

The table attributes file 204-2 for this example shows that the CUSTOMERS, STORES, PRODUCTS, and DATES tables in the simulation database 130 are "reference" tables (table type='R') as indicated by column 804-2. This means that the number of rows specified for each of these tables in column 804-3 in the table attributes file 204-2 will not be adjusted for different sizes of the simulation database 130. In other words, no matter the size of the simulation database 130, the PRODUCTS table will always have 50 rows, for example.

The SALES table in the simulation database 130 is a "main" table (table type='M') as indicated by column 804-2. This means that the number of rows specified for this table in the table attributes file 204-2, which is 10,000 as indicated by the column 804-3, is a proportional or relative number of rows. To calculate the actual number of rows to generate for each main table, the program builder component 110 reads the desired size of the simulation database 130 from the generation environment file 204-3 in the structured input file 106, subtracts the aggregate size of all of the reference tables, and then apportions the remaining space among the main tables in proportion to the number of rows specified for each main table.

To complete examples for the structured input file 106 consistent with the previous examples, the generation environment file 204-3 is a text file that contains "records." Each record begins with a name that identifies the type of information the record supplies. Following the name, each type of record has its own format. A record might span multiple lines of the file.

A first record in the generation environment file 204-3 for this example is a DATABASE record, as follows:

database size=1 unit=G dfltobs=1000

The DATABASE record for this example tells the program builder component 110 that: (1) the simulation database 130 will have a size of one gigabyte (size=1, unit=G); and (2) the sizes specified on the SESSION records will be interpreted as a number of gigabytes (unit=G). If the table attributes file 204-2 does not specify the number of rows for a table, the table will be generated with 1,000 rows as a default.

After the DATABASE record, the generation environment file 204-3 contains a number of SESSION records. The number of SESSION records tells the program builder component 110 how many data generating sessions 126-1-*b* are to be created and used during execution of the data generator program 120. For example, this example may include four SESSION records, thereby indicating that the program builder component 110 should program the data generator program 120 for executing four data generating sessions 126-1-*b*. The program builder component 110 writes program code to the data generator program 120 that will execute in each data generating sessions 126-1-*b* so that data for several tables can be generated substantially simultaneously, or so that several data generating sessions 126-1-*b* can substantially simultaneously generate data for different parts of the same table.

Each SESSION record gives the program builder component 110 information about one of the data generating sessions 126-1-*b*. An example of SESSION record may be as follows:

```
session   hostname='bigiron.datagen.com'
          userid='dguser' password='dguserpw'
          size='50'
          sascmd='sas -path /usr2/auxlib'
          cmdtype='script'
          script='/newraid1/dguser/example/misc/tcp.scr'
          altlog='misc/dmr_log'
          sortsize='256M'
          sumsize='0'
          maxmemquery='512M'
          memsize='768M'
          realmemsize='0'
          autoexec='/usr2/dguser/example/datagen/autoexec.sas'
          data='/newraid2/dguser/example/sasdata'
          temp='/wilbur/dguser/example/sastemp'
          cd='/newraid2/dguser/example/'
          work='saswork'
          misc='misc/'
      utilloc='/wilbur/dguser/sortwork'
```

The SESSION record for this example informs the program builder component 110 of the following information:
1) This particular data generating session 126-1 will execute on the computer named "bigiron.datagen.com." All data generating sessions 126-1-*b* can execute on the same computer, or some data generating sessions 126-1-*b* can execute on one computer while other data generating sessions 126-1-*b* execute on one or more other computers.

2) Because a data generating session 126-1 is being created on the computer "bigiron.datagen.com," a userid and password are supplied for use during creation of the data generating session 126-1. Since data generating sessions 126-1-*b* can be created in a variety of ways, a userid and password are not always required.

3) The "size=" parameter tells the program builder component 110 that the data generating session 126-1-*b* has 50 units of space available to create the files it generates in the simulation database 130. The program builder component 110 uses this information to ensure that it does not assign a data generating session 126-1-*b* a bigger file than the data generating session 126-1-*b* can generate.

4) The "sascmd=" parameter tells the program builder component 110 the command that will invoke the commercial software that will execute the program code that the program builder component 110 writes to the data generator program 120.

5) The "cmdtype=" and "script=" options give the program builder component 110 more information about creating the data generating session 126-1-*b*. As data generating sessions 126-1-*b* can be created in a variety of ways, these parameters might not be specified, or might be specified differently, in other data generating situations.

The remaining parameters are not used by the program builder component 110, but are passed to the commercial software that executes that program code that the program builder component 110 writes to the data generator program 120.

A third type of record in the generation environment file 204-3 is the LIBDEF record. This type of record associates physical storage locations with logical names. The logical names are used internally by the program builder component 110 and by the data generator program 120.

The program builder component 110 uses the mapping specified by the LIBDEF records and copies that information to the data generator program 120. Examples of LIBDEF records may be as follows:

```
libdef ddsdata='/usr2/dguser/example/skeletons'     access=readonly
libdef projfmts='/usr2/dguser/example/formats'
libdef reports='/usr2/dguser/example/reports'
libdef initvals='/usr2/dguser/example/initvals'     access=readonly
libdef geninfo='/usr2/dguser/example/gendata'       access=readonly
libdef viewlib='/usr2/dguser/example/viewlib'       access=readonly
libdef reflib='/usr2/dguser/example/reflib'         access=readonly
libdef addr='/wilhelm/dguser/census/tiger'          access=readonly
```

The logical name "initvals" refers to the initial values data library 202-2 that contains files of initial values. The logical name "geninfo" refers to the rules data library 202-4 that contains rules, groups, and composites. The logical name "viewlib" refers to the data view data library 202-3 that contains data views. The logical name "reflib" refers to the reference data library 202-5 of reference files. The logical name "ddsdata" refers to the database definition data library 202-1 that defines the structure of the simulation database 130 that is to be generated. Both the program builder component 110 and the data generator program 120 may read data from files in these libraries. Other logical names might be used by the program builder component 110 to produce the data generator program 120, and they might be used by the data generator program 120. The program builder component 110 copies all of these associations to the data generator program 120.

Another type of record in the generation environment file 204-3 that associates logical names and physical names is the FILEDEF record. The FILEDEF records in the generation environment file for this example may appear as follows:

```
filedef emitters='/usr2/dguser/dev/emitters'
filedef wrappers='/usr2/dguser/dev/wrappers'
```

The files in the "emitters" and "wrappers" logical storage locations are used by the program builder component 110 to write program code to the data generator program 120. These are in the program code libraries 206-1-*e*. This example does not use files in the include library 206-3 or the post-include library 206-4.

The third type of record in the generation environment file that maps logical names to physical names is the FILES record. Unlike the LIBDEF and FILEDEF records which map logical names to aggregate storage locations, though, the FILES record maps logical names to individual files. The FILES record for this example may appear as follows:

```
files          genparm='genparm.sas'
               genprog='datagen.sas'
               genemit='genemit.sas'
               genwrap='genwrap.sas'
               xref='crossref.txt'
               tblinfo='tblinfo.txt'
```

The logical name "genprog" refers to the data generator program 120, which is created by the program builder component 110. The logical name "genparm" refers to a file created by the program builder component 110 that contains various kinds of identification and mapping information. It is used by the data generator program 120, and can be used by user-written programs that read data from the generated simulation database 130. The logical names "genemit" and "genwrap" refer to files that the program builder component 110 uses as workspace while it executes. The logical names "xref" and "tblinfo" refer to the cross-reference file 204-1 and the table attributes file 204-2, respectively.

Additional records in the generation environment file 204-3 can be used to specify various attributes of code sources 124-1-*a* (e.g., emitters, composites, etc.). Those records are not used in this example.

Once the various input files of the structured input file 106 have been constructed, the structured input file 106 may be used as input for the program builder component 110. The program builder component 110 reads the various parts of the structured input file 106, and begins building the data generator program 120. This may comprise beginning execution of computer software that is commercially available (on a computer that is commercially available) and supplying it with the files of program code that comprise the program builder component 110, and the name of the generation environment file 204-3. As the program builder component 110 executes, it reads the various input files from the structured input file 106.

As is customary with computer software, the user should check for and correct errors after executing the program builder component 110. The program builder component 110 diagnoses many validity and consistency problems, so it is sometimes necessary to correct files for the structured input file 106, and then re-execute the program builder component 110 until all errors are eliminated.

The length of time required to execute the program builder component 110 depends somewhat on the complexity of the structure of the simulation database 130 to be created, but it does not necessarily depend on the amount of data that will ultimately be written to the simulation database 130. On current commercially-available computers, the amount of time required to execute the program builder component 110 is typically as short as a few seconds to as long as a few minutes.

The output of the program builder component 110 is a file of program code (e.g., the file associated with the logical name "genprog" in the generation environment file), a file of location mapping information (e.g., the file associated with the logical name "genparm" in the generation environment file), and several reports. The file of program code statements is the data generator program 120, which is subsequently executed to generate the simulated data 122 and the simulation database 130. The data generator program 120 includes program code statements that read the file of location mapping information.

Once the program builder component 110 finishes producing the data generator program 120, the data generator program 120 may be subsequently executed to generate the simulated data 122 and the simulation database 130. It may be appreciated that the execution phase of the program builder component 110 is at a different time from the execution phase of the data generator program 120. The data generator program 120 may be executed by the same (or different) commercial software and/or computer that was used to execute the program builder component 110, but this time supplies it with the files created by the program builder component 110.

Depending on the size and complexity of the simulation database 130 to be created, and the capabilities of the one or more computers used to execute the data generator program 120, the amount of time needed for executing the data generator program 120 to build the simulation database 130 can be as short as a few seconds to as long as many months.

Once the simulation database 130 has been created and populated with the simulated data 122, the file of location mapping information that the program builder component 110 created can be used by the application program 140 for its intended purposes (e.g., measurement, testing, demonstrations, performance evaluations, and so forth).

Figure 9:
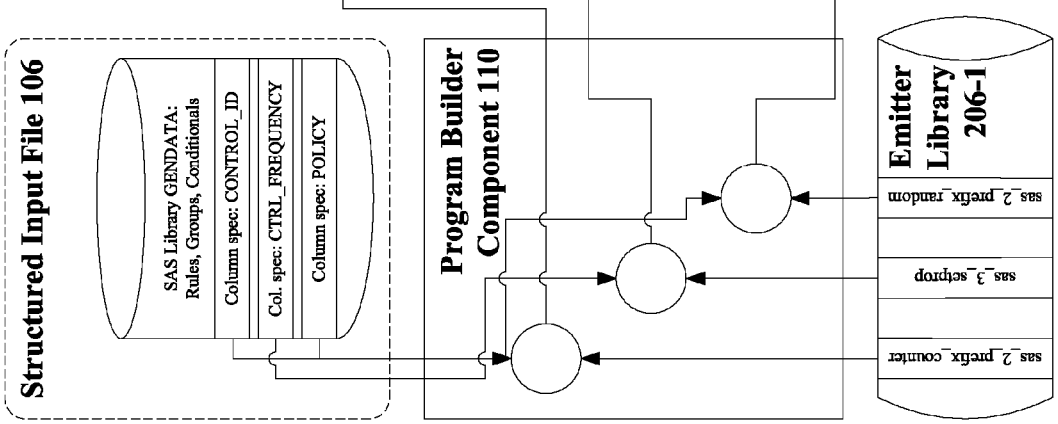
FIG. 9 illustrates an embodiment of a third system.

FIG. 9 illustrates an embodiment of a system 900. System 900 is similar to systems 100, 200, and provides more details regarding the source code version 152 of the data generator program 120.

In various embodiments, the program builder component 110 may produce the data generator program 120 as a set of subprograms 902-1-$p$. Each subprogram 902-1-$p$ is a group of program code statements and may be associated with one of the multiple data generating sessions 126-1-$b$ to generate a portion of the simulated data 122 for a portion of the simulation database 130. Each set of subprograms 902-1-$p$ runs in one of the data generating sessions 126-1-$b$ for a portion of the processing time. When executed, the program builder component 110 receives and processes various input files from the structured input file 106, selects various groups of program code statements from the program code libraries 206-1-$e$, and writes the selected groups of program code statements to the source code version 152 of the data generator program 120.

The subprograms 902-1-$p$ are organized so that the most independent tables in the simulation database 130 are built first, then the tables that depend on them are built next, and so on until all of the tables are populated. Whenever possible, the program builder component 110 attempts to assign multiple subprograms to execute simultaneously in multiple data generating sessions 126-1-$b$ to save processing time. It may be appreciated that a given subprogram 902-1-$p$ may correspond to one or more data generating sessions 126-1-$b$, and that multiple subprograms 902-1-$p$ may correspond to a single data generating session 126-1-$b$. The embodiments are not limited in this context.

Operations for the above-described embodiments may be further described with reference to one or more logic flows. It may be appreciated that the representative logic flows do not necessarily have to be executed in the order presented, or in any particular order, unless otherwise indicated. Moreover, various activities described with respect to the logic flows can be executed in serial or parallel fashion. The logic flows may be implemented using one or more hardware elements and/or software elements of the described embodiments or alternative elements as desired for a given set of design and performance constraints. For example, the logic flows may be implemented as logic (e.g., computer program instructions) for execution by a logic device (e.g., a general-purpose or specific-purpose computer).

FIG. 10 illustrates one embodiment of a logic flow 1000. The logic flow 1000 may be representative of some or all of the operations executed by one or more embodiments described herein.

In the illustrated embodiment shown in FIG. 10, the logic flow 1000 may receive by the processor 102 the structured input file 106 with definitions to generate simulated data 122 for the simulation database 130 at block 1002. For example, the processor 102 may execute the program builder component 110, which receives as input the one or more input files comprising the structured input file 106, the input files having database definitions to generate database objects and simulated data 122 for the simulation database 130.

The logic flow 1000 may produce by the processor 102 the data generator program 120 based on the structured input file 106. For example, the program builder component 110 may process the various input files from the structured input file 106, and produce the data generator program 120 based on the database definitions provided by the various files of the structured input file 106. Once generated, the data generator program 120 may be executed to generate the simulated data 122 for the simulation database 130 using multiple data generating sessions 126-1-$b$ executed concurrently or sequentially at block 1008.

The program builder component 110 may process the various input files from the structured input file 106, and produce the data generator program 120 based on the database definitions provided by the various files of the structured input file 106. An exemplary implementation is as follows.

The program builder component 110 begins processing by reading the input files comprising part of the structured input file 106. The program builder component 110 checks for extra members in the initial values data library 202-2 and the seed values data library 202-6. The program builder component 110 checks to make sure column properties in these libraries match the simulation database 130.

The program builder component 110 determines when columns are a simple key, a composite key, or are derived less directly. The program builder component 110 determines the order in which the tables should have their data generated, and groups the tables into computational phases. A computational phase is a defined period of time or set of program operations when one or more data generating sessions 126-1-$b$ are operating in a substantially simultaneous manner to create one or more tables 132-1-$c$ of the simulation database 130.

A table in the simulation database 130 is a child of another table in the simulation database 130 if it reads data from the other table. A parent table can have more than one child, and a child table can have more than one parent. A table can be a parent of some tables while it is a child of other tables. Tables that are not children have their data generated during a first computational phase. Tables that are children of the tables built in the first computational phase have their data generated during a second computational phase. Tables that are children of the tables built in the first and second computational phases have their data generated during a third computational phase. This process continues until all tables have their data generated. The number of computational phases is arbitrary, and is selected based on a number of computational phases needed to generate all the tables in the simulation database 130.

There are several ways in which the process of generating the data for a table in the simulation database 130 can include reading data from another table in the simulation database 130. For instance, assume one or more columns in a table are a foreign key. The table with the foreign key is the child, and the table with the primary key is the parent. When the data for a column in a table is generated by a view and the view reads from one or more other tables in the simulation database 130, the table that reads data from the view is the child table, and each table read by the view is a parent table. Similar to a view, when an emitter, composite, or include file provide the program code statements that generate the data for a given column, and the program code statements read from another table in the simulation database 130, the table that contains the column whose data is being generated is the child table, and each table read by the generated code is a parent table.

The program builder component 110 may determine how many rows to generate for each table. If the size of the simulation database 130 specified in the generation environment file is zero, all row counts specified in the table attributes file are used as is. If a nonzero simulation database 130 size is specified, the program builder component 110 adds all of the sizes of the fixed-row-count tables and subtracts that total from the specified size of the simulation database 130. This gives the amount of space to be filled by proportionally-sized tables. The program builder component 110 reads the specified row counts and column widths of the proportionally-sized tables and determines each table's "fair share" of the remaining space in the simulation database 130. The program builder component 110 converts the "fair share" space amount into a number of rows to generate for each proportionally-sized table.

The program builder component 110 assigns tables to data generating sessions 126-1-*b* based on generation order, distribution of work, and table sizes versus available space in each data generating session 126-1-*b*.

The program builder component 110 combines the parent-child, source name and type, and mapping information to determine how the data for each column in the simulation database 130 is to be generated. The program builder component 110 verifies that every column has a code source 124-1-*a* and every specified code source 124-1-*a* is used.

The program builder component 110 applies within-table column source, ordering, grouping, and dependency information to determine the order in which the data for the columns in each table is to be generated. If there are integrity constraints, the program builder component 110 records whether each column is allowed to have missing values.

The program builder component 110 divides each table's work into work units, with each work unit having different phases, including without limitation an expansion phase, a subassembly phase, a final assembly phase, and a cleanup phase.

At this point, the program builder component 110 has produced a master file that contains one record for each action for each column in the generated simulation database 130. The program builder component 110 then writes groups of program code statements for the data generator program 120. The program builder component 110 writes files that configure the data generating sessions 126-1-*b*. These are executed during initialization of each data generating session 126-1-*b*. The program builder component 110 writes program code statements to the data generator program 120 that create the data generating sessions 126-1-*b*. The program builder component 110 writes program code statements to the data generator program 120 that execute at the beginning and end of each computational phase. These program code statements start and stop sessions, collect statistics, and synchronize. The program builder component 110 writes complete program code statements to the data generator program 120 that execute during the expansion phase of each computational phase. The program builder component 110 writes complete program code statements to the data generator program 120 that execute during the subassembly phase of each computational phase. The program builder component 110 provides a unique seed for each column in case its data-generation code uses a random number generator. The program builder component 110 writes complete program code statements to the data generator program that execute during the final assembly phase of each computational phase. When a table is built by a single operation, this is a program code statement that builds the entire table. When a table is built by multiple data generating sessions 126-1-*b*, this is a set of program code statements, one of which executes in each data generating session 126-1-*b*. The program builder component 110 provides a unique seed for each column in case its data-generation code uses a random number generator. If the data for a table is generated by multiple data generating sessions 126-1-*b*, the program builder component 110 writes program code statements to combine the temporary files from the sessions to build the table in the simulation database 130. The program builder component 110 writes program code statements to clean up the temporary files created while building the table. When a table is built by multiple data generating sessions 126-1-*b*, the program builder component 110 writes cleanup program code statements for each data generating session 126-1-*b*. The program builder component 110 then writes program code statements to detect errors that occur in the data generating sessions 126-1-*b* and stops the data generation process early if necessary.

The above-described operation for the program builder component 110 is written from the point of view of creating simulated data 122 from scratch. The program builder component 110 can also create program code statements that read an input table and selectively copy, modify, or replace data in columns to build the output table. The output table may have more or fewer rows than the input table. When used in this mode, the program builder component 110 creates program code statements that read the input table and then execute program code statements for specified columns. These program code statements can be any of the regular sources (e.g., emitters, views, user-supplied, and so on). It has access to the column's value on each row of the input table and can modify or replace it.

Figure 11:
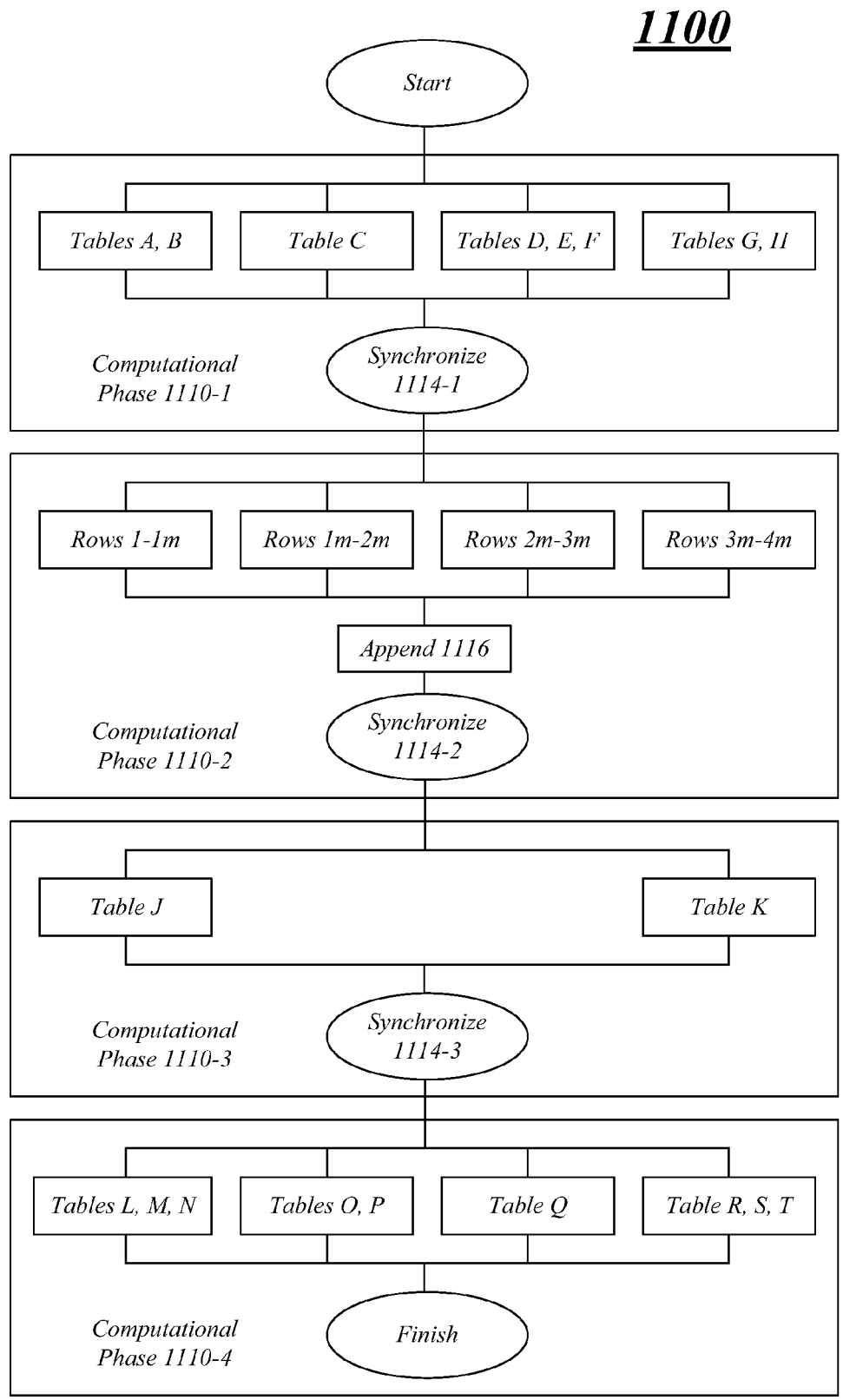
FIG. 11 illustrates an embodiment of a second logic flow.

FIG. 11 illustrates an embodiment of a logic flow 1100. The logic flow 1100 may provide further details regarding the operations of the data generator program 120. As discussed with operations for the program builder component 110, the data generator program 120 is produced by writing program code that corresponds to various data generating sessions 126-1-*b*, various computational phases, and multiple work units for each computational phase. The logic flow 1100 illustrates operations for the data generator program 120 during execution in terms of these various program codes.

In various embodiments, the data generator program 120 may be arranged to generate simulated data 122 for tables of the simulation database 130 using multiple computational phases 1110-1-$q$ until all tables 132-1-$c$ for the simulation database 130 are populated. Each computational phase 1110-1-$q$ is a defined period of time or set of program operations when one or more data generating sessions 126-1-$b$ are operating in a substantially simultaneous manner to create one or more tables 132-1-$c$ of the simulation database 130. Each computational phase 1110-1-$q$ may build multiple tables concurrently or in parallel, with synchronization points between the computational phases 1110-1-$q$.

In the illustrated embodiment shown in FIG. 11, the system 1100 may have four (4) computational phases 1100-1 to 1100-4. More or less computational phases 1100-1-$q$, however, may be used as desired for a given implementation. The data generator program 120 may be arranged to generate simulated data 122 for tables 132-1-$c$ of the simulation database 130 using multiple computational phases 1110-1 to 1110-4. Each computational phase 1110-1-$q$ may comprise a set of substantially simultaneously executed work units followed by a synchronization point 1114-1-$r$. As shown in FIG. 11, there are three (3) synchronization points 1114-1 to 1114-3, one after each of the respective computational phases 1110-1 to 1110-3. Each work unit may comprise multiple phases. Typically each phase is one or more data operations. As previously described, each work unit may include one or more of an expansion phase, a subassembly phase, a final assembly phase, and a cleanup phase.

By way of example, assume the program builder component 110 is executed and produces a data generator program 120 named "datagen.sas." When the data generator program 120 named "datagen.sas" is started, it executes SIGNON statements to create the remote data generating sessions 126-1-$b$. This example assumes four remote data generating sessions 126-1-$b$, although there can be as many remote data generating sessions 126-1-$b$ as needed for a given implementation.

As previously described, each computational phase 1110-1-$q$ may comprise a set of substantially simultaneously executed work units followed by a synchronization point 1114-1-$r$. Each computational phase 1110-1-$q$ builds one or more tables 132-1-$c$ in the target simulation database 130. This example shows four computational phases 1110-1 to 1110-4 reading down vertically from START to FINISH. There can be as many computational phases 1110-1-$q$ as needed. If fewer tables 132-1-$c$ are to be built during a computational phase 1110-1-$q$ than the number of remote data generating sessions 126-1-$b$, some of the remote data generating sessions 126-1-$b$ sit idle during that computational phase 1110-1-$q$. If more tables 132-1-$c$ are to be built during a computational phase 1110-1-$q$ than the number of remote data generating sessions 126-1-$b$, some remote data generating sessions 126-1-$b$ build more than one table 132-1-$c$.

During a first computational phase 1110-1, the data generator program 120 builds tables that have no dependencies on other tables in the simulation database 130. As shown in FIG. 11, groups of tables A-H are built in parallel during the four data generating sessions 126-1 to 126-4. The tables A-H are then synchronized at synchronization point 1114-1. The data generator program 130 named "datagen.sas" may use WAITFOR statements to synchronize the remote data generating sessions 126-1 to 126-4, for example.

During a second computational phase 1110-2, the data generator program 120 builds tables that depend on tables that were built during the first computational phase 1110-1. Furthermore, if a given table is relatively large, the remote data generating sessions 126-1-$b$ can be modified to build a portion of the rows in the table, and then a set of PROC APPEND statements combine the row "slices" into a single database table. For example, during the second computational phase 1110-2 different data generating sessions 126-1-$b$ build respective rows 1-1M, 1M-2M, 2M-3M and 3M-4M of table I, which are appended together at an append point 1116 using PROC APPEND statements to form the complete table I. The tables are then synchronized at synchronization point 1114-2.

During a third computational phase 1110-3, the data generator program 120 builds tables that depend on tables built in the first and second computational phases 1110-1, 1110-2. For example, Tables J, K are built during the third computational phase 1110-3, and synchronized at synchronization point 1114-3.

During a fourth computational phase 1110-4, remaining tables are built that depend on tables built in any of the earlier computational phases 1110-1 to 1110-3. For instance, tables L-T are built (and synchronized) during the fourth computational phase 1110-4. When finished, the data generation program 120 named "datagen.sas" executes SIGNOFF statements to terminate the remote data generating sessions 126-1-$b$, and the simulation database 130 is complete and ready for use by the application program 140.

Referring again to FIG. 9 and system 900, the program builder component 110 may produce the data generator program 120 as a set of subprograms 902-1-$p$ organized to sequentially generate simulated data 122 for the simulation database 130 in multiple computational phases 1110-1-$q$, with a first computational phase 1110-1 to generate simulated data 122 for independent tables of the simulation database 130 and a second computational phase 1110-2 to generate simulated data 122 for dependent tables from the independent tables. Subsequent computational phases 1110-3-$q$ may be used for other dependent tables until all tables for the simulation database 130 have been populated.

In various embodiments, the program builder component 110 may produce the data generator program 120 as a set of subprograms 902-1-$p$ organized to concurrently generate simulated data 122 for defined tables 132-1-$c$ of the simulation database 130. For example, two or more of the multiple data generating sessions 126-1-$b$ may be executed substantially simultaneously to generate simulated data 122 for two or more tables 132-1-$c$ of the simulation database 130.

In various embodiments, the program builder component 110 may produce the data generator program 120 as a set of subprograms 902-1-$p$ organized to sequentially generate simulated data 122 for defined tables 132-1-$c$ of the simulation database 130. For example, a first data generating session 126-1 or a first computational phase 1110-1 may be executed and completed before a second data generating session 126-2 or a second computational phase 1110-2 is executed and completed. In this manner, the simulated data 122 is generated for two or more tables 132-1-$c$ of the simulation database 130 at different times. When computational phases 1110-1-$q$ are implemented in sequence, the data generator program 120 may synchronize output from multiple computational phases 1110-1-$q$ at a synchronization point 1114-1-$r$ for each computational phase 1110-1-$q$.

Figure 12:
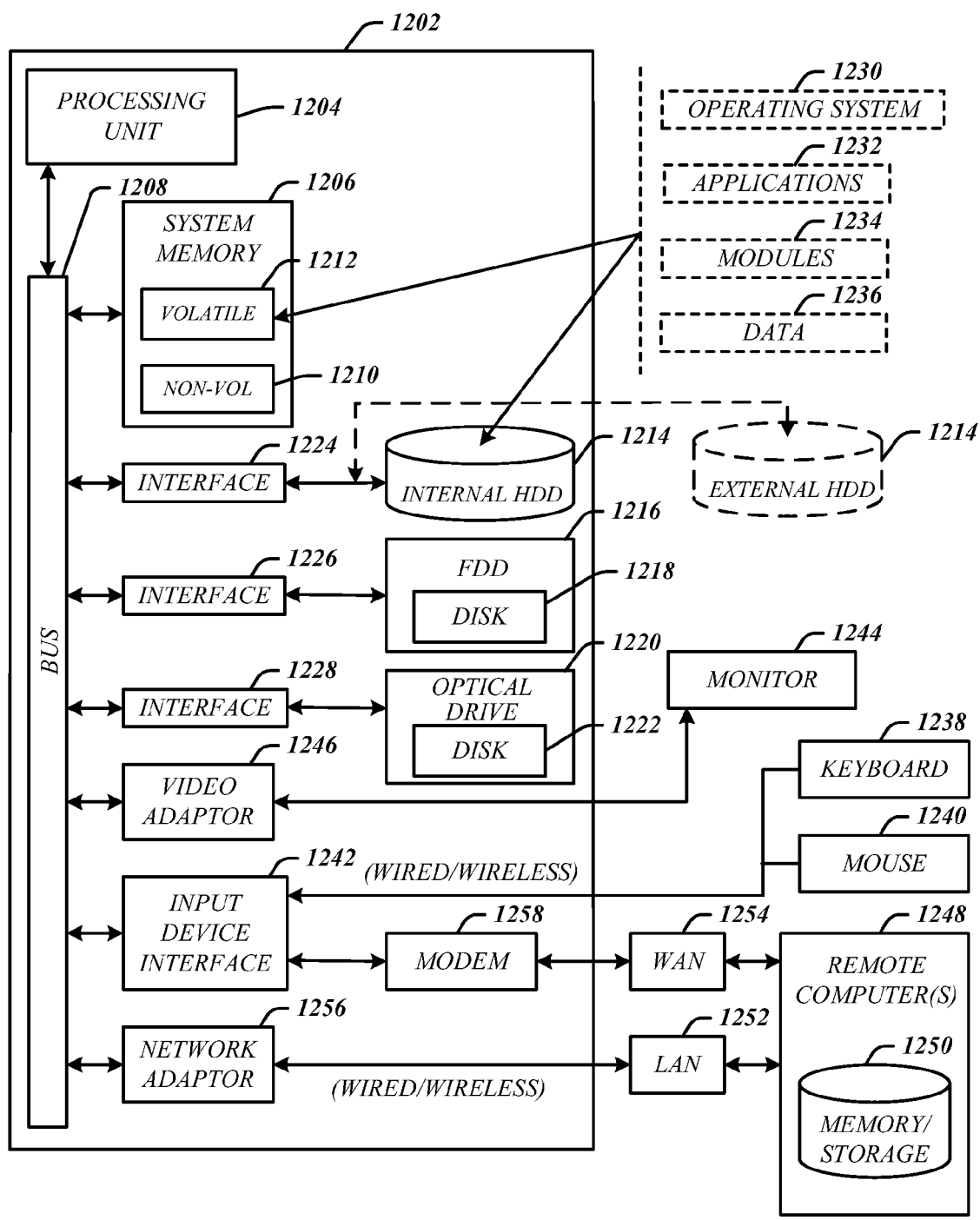
FIG. 12 illustrates an embodiment of a computing architecture.

FIG. 12 illustrates an embodiment of an exemplary computing architecture 1200 suitable for implementing various embodiments as previously described. The computing architecture 1200 includes various common computing elements, such as one or more processors, co-processors, memory units, chipsets, controllers, peripherals, interfaces, oscillators, timing devices, video cards, audio cards, multimedia input/output (I/O) components, and so forth. The embodiments, however, are not limited to implementation by the computing architecture 1200.

As shown in FIG. 12, the computing architecture 1200 comprises a processing unit 1204, a system memory 1206 and a system bus 1208. The processing unit 1204 can be any of various commercially available processors. Dual microprocessors and other multi-processor architectures may also be employed as the processing unit 1204. The system bus 1208 provides an interface for system components including, but not limited to, the system memory 1206 to the processing unit 1204. The system bus 1208 can be any of several types of bus structure that may further interconnect to a memory bus (with or without a memory controller), a peripheral bus, and a local bus using any of a variety of commercially available bus architectures.

The system memory 1206 may include various types of memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. In the illustrated embodiment shown in FIG. 12, the system memory 1206 can include non-volatile memory 1210 and/or volatile memory 1212. A basic input/output system (BIOS) can be stored in the non-volatile memory 1210.

The computer 1202 may include various types of computer-readable storage media, including an internal hard disk drive (HDD) 1214, a magnetic floppy disk drive (FDD) 1216 to read from or write to a removable magnetic disk 1218, and an optical disk drive 1220 to read from or write to a removable optical disk 1522 (e.g., a CD-ROM or DVD). The HDD 1214, FDD 1216 and optical disk drive 1220 can be connected to the system bus 1208 by a HDD interface 1224, an FDD interface 1226 and an optical drive interface 1228, respectively. The HDD interface 1224 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 1210, 1212, including an operating system 1230, one or more application programs 1232, other program modules 1234, and program data 1236. The one or more application programs 1232, other program modules 1234, and program data 1236 can include, for example, the program builder component 110, the data generator program 120, application program 140 or any other software or hardware elements as illustrated and described with reference to any of the above-described embodiments.

A user can enter commands and information into the computer 1202 through one or more wire/wireless input devices, for example, a keyboard 1238 and a pointing device, such as a mouse 1240. Other input devices may include a microphone, an infrared (IR) remote control, a joystick, a game pad, a stylus pen, touch screen, or the like. These and other input devices are often connected to the processing unit 1204 through an input device interface 1242 that is coupled to the system bus 1208, but can be connected by other interfaces such as a parallel port, IEEE 1394 serial port, a game port, a USB port, an IR interface, and so forth.

A monitor 1244 or other type of display device is also connected to the system bus 1208 via an interface, such as a video adaptor 1246. In addition to the monitor 1244, a computer typically includes other peripheral output devices, such as speakers, printers, and so forth.

The computer 1202 may operate in a networked environment using logical connections via wire and/or wireless communications to one or more remote computers, such as a remote computer 1248. The remote computer 1248 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1250 is illustrated. The logical connections depicted include wire/wireless connectivity to a local area network (LAN) 1252 and/or larger networks, for example, a wide area network (WAN) 1254. Such LAN and WAN networking environments are commonplace in offices and companies, and facilitate enterprise-wide computer networks, such as intranets, all of which may connect to a global communications network, for example, the Internet.

When used in a LAN networking environment, the computer 1202 is connected to the LAN 1252 through a wire and/or wireless communication network interface or adaptor 1256. The adaptor 1256 can facilitate wire and/or wireless communications to the LAN 1252, which may also include a wireless access point disposed thereon for communicating with the wireless functionality of the adaptor 1256.

When used in a WAN networking environment, the computer 1202 can include a modem 1258, or is connected to a communications server on the WAN 1254, or has other means for establishing communications over the WAN 1254, such as by way of the Internet. The modem 1258, which can be internal or external and a wire and/or wireless device, connects to the system bus 1208 via the input device interface 1542. In a networked environment, program modules depicted relative to the computer 1202, or portions thereof, can be stored in the remote memory/storage device 1250. It will be appreciated that the network connections shown are exemplary and other means of establishing a communications link between the computers can be used.

The computer 1202 is operable to communicate with wire and wireless devices or entities using the IEEE 802 family of standards, such as wireless devices operatively disposed in wireless communication (e.g., IEEE 802.12 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wireless Fidelity (Wi-Fi), WiMax, and Bluetooth™ wireless technologies. Thus, the communication can be a predefined structure as with a conventional network or simply an ad hoc communication between at least two devices. Wi-Fi networks use radio technologies called IEEE 802.12x (a, b, g, etc.) to provide secure, reliable, fast wireless connectivity. A Wi-Fi network can be used to connect computers to each other, to the Internet, and to wire networks (which use IEEE 802.3-related media and functions).

Figure 13:
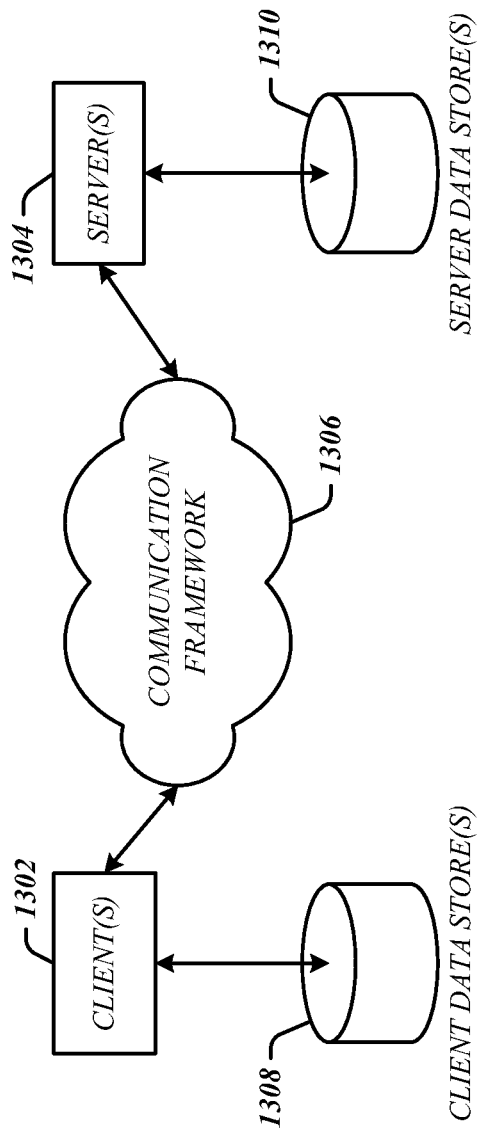
FIG. 13 illustrates an embodiment of a communications architecture.

FIG. 13 illustrates a block diagram of an exemplary communications architecture 1300 suitable for implementing various embodiments as previously described. The communications architecture 1300 includes various common communications elements, such as a transmitter, receiver, transceiver, radio, network interface, baseband processor, antenna, amplifiers, filters, and so forth. The embodiments, however, are not limited to implementation by the communications architecture 1300.

As shown in FIG. 13, the communications architecture 1300 comprises includes one or more clients 1302 and servers 1304. The clients 1302 may implement the client systems 310, 400. The servers 1304 may implement the server system 330. The clients 1302 and the servers 1304 are operatively connected to one or more respective client data stores 1308 and server data stores 1310 that can be employed to store information local to the respective clients 1302 and servers 1304, such as cookies and/or associated contextual information.

The clients 1302 and the servers 1304 may communicate information between each other using a communication framework 1306. The communications framework 1306 may implement any well-known communications techniques, such as techniques suitable for use with packet-switched networks (e.g., public networks such as the Internet, private networks such as an enterprise intranet, and so forth), circuit-switched networks (e.g., the public switched telephone network), or a combination of packet-switched networks and circuit-switched networks (with suitable gateways and translators). The clients 1302 and the servers 1304 may include various types of standard communication elements designed to be interoperable with the communications framework 1306, such as one or more communications interfaces, network interfaces, network interface cards (NIC), radios, wireless transmitters/receivers (transceivers), wired and/or wireless communication media, physical connectors, and so forth. By way of example, and not limitation, communication media includes wired communications media and wireless communications media. Examples of wired communications media may include a wire, cable, metal leads, printed circuit boards (PCB), backplanes, switch fabrics, semiconductor material, twisted-pair wire, co-axial cable, fiber optics, a propagated signal, and so forth. Examples of wireless communications media may include acoustic, radio-frequency (RF) spectrum, infrared and other wireless media. One possible communication between a client 1302 and a server 1304 can be in the form of a data packet adapted to be transmitted between two or more computer processes. The data packet may include a cookie and/or associated contextual information, for example.

Various embodiments may be implemented using hardware elements, software elements, or a combination of both. Examples of hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some embodiments may comprise an article of manufacture. An article of manufacture may comprise a storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 312 C.F.R. Section 1.152(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer-implemented method, comprising:
receiving, by a program builder component executed on a processor, a structured input file comprising one or more data libraries and one or more directive files to generate simulated data for a simulation database; and
producing, by the program builder component executed on the processor, a data generator program based on the structured input file, the data generator program arranged to generate the simulated data for the simulation database using multiple data generating sessions executed concurrently or sequentially.

2. The computer-implemented method of claim 1, comprising selecting program code modules from multiple code sources based on the structured input file to produce the data generator program.

3. The computer-implemented method of claim 1, comprising writing selected program code modules to the data generator program.

4. The computer-implemented method of claim 1, comprising producing the data generator program as a set of subprograms, each subprogram associated with one of the multiple data generating sessions to generate a portion of the simulated data for a portion of the simulation database.

5. The computer-implemented method of claim 1, comprising generating user error reports when producing the data generator program in response to errors in the structured input file.

6. The computer-implemented method of claim 1, comprising compiling a source code version of the data generator program into an executable code version of the data generator program.

7. The computer-implemented method of claim 1, comprising generating the simulated data for the simulation database by the data generator program.

8. The computer-implemented method of claim 1, comprising generating simulated data for tables of the simulation database using multiple computational phases until all tables for the simulation database are populated.

9. The computer-implemented method of claim 1, comprising generating simulated data for tables of the simulation database using multiple computational phases, each computational phase comprising a set of simultaneously executed work units followed by a synchronization point, each work unit comprising an expansion phase, a subassembly phase, a final assembly phase, and a cleanup phase.

10. The computer-implemented method of claim 1, comprising producing the data generator program as a set of subprograms organized to sequentially generate simulated data for the simulation database in multiple computational phases, with a first computational phase to generate simulated data for independent tables of the simulation database and a second computational phase to generate simulated data for dependent tables from the independent tables.

11. The computer-implemented method of claim 1, comprising producing the data generator program as a set of subprograms organized to concurrently generate simulated data for defined tables of the simulation database.

12. The computer-implemented method of claim 1, comprising producing the data generator program as a set of subprograms organized to sequentially generate simulated data for defined tables of the simulation database.

13. The computer-implemented method of claim 1, comprising synchronizing output from multiple computational phases at a synchronization point for each computational phase.

14. The computer-implemented method of claim 1, comprising storing the simulation data in the simulation database configured for testing an application program.

15. An article of manufacture comprising a non-transitory computer-readable storage medium containing instructions that when executed enable a processor to:
receive a structured input file comprising one or more data libraries and one or more directive files to generate simulated data for a simulation database; and
convert the structured input file into a data generator program arranged to generate the simulated data for the simulation database using multiple code sources and multiple data generating sessions executed concurrently or sequentially.

16. The article of claim 15, further comprising instructions that when executed enable the processor to select program code modules from a program code library based on the structured input file, and write the selected program code modules to the data generator program.

17. The article of claim 15, further comprising instructions that when executed enable the processor to produce the data generator program as a set of subprograms, each subprogram corresponding to one of the multiple data generating sessions to generate a portion of the simulated data for a portion of the simulation database.

18. The article of claim 15, further comprising instructions that when executed enable the processor to compile the data generator program into an executable file arranged for independent execution by the processor.

19. The article of claim 15, further comprising instructions that when executed enable the processor to generate simulated data for tables of the simulation database using multiple computational phases until all tables for the simulation database are populated, each computational phase comprising a set of simultaneously executed work units followed by a synchronization point, each work unit comprising an expansion phase, a subassembly phase, a final assembly phase, and a cleanup phase.

20. The article of claim 15, further comprising instructions that when executed enable the processor to produce the data generator program as a set of subprograms organized to sequentially generate simulated data for the simulation database in multiple computational phases, with a first computational phase to generate simulated data for independent tables of the simulation database and a second computational phase to generate simulated data for dependent tables from the independent tables.

21. The article of claim 15, further comprising instructions that when executed enable the processor to synchronize output from multiple computational phases at a synchronization point for each computational phase.

22. The article of claim 15, further comprising instructions that when executed enable the processor to store the simulation data in the simulation database configured for testing an application program.

23. An apparatus, comprising:
a processor; and
a memory unit to couple to the processor, the memory unit to store a program builder component that when executed by the processor is operative to receive a structured input file comprising one or more data libraries and one or more directive files to generate simulated data for a simulation database, and produce a data generator program based on the structured input file, the data generator program arranged to generate the simulated data for the simulation database using multiple data generating sessions executed concurrently or sequentially.

24. The apparatus of claim 23, the structured input file comprising one or more data libraries including a database definition data library, an initial values data library, a data view data library, a rules data library or a reference data library.

25. The apparatus of claim 23, the structured input file comprising one or more directive files including a cross-reference file, a table attributes file or a generation environment file.

26. The apparatus of claim 23, the program builder component operative to build the data generator program using one or more program code libraries including an emitter library, composite library, include library and post-include library.

27. The apparatus of claim 23, comprising a compiler communicatively coupled to the program builder component, the compiler operative to compile a source code version of the data generator program into an executable code version of the data generator program.

28. The apparatus of claim 23, the data generator program arranged to store the simulation data in the simulation database configured for testing the application program.

29. The computer-implemented method of claim 1, the structured input file comprising one or more data libraries including a database definition data library, an initial values data library, a data view data library, a rules data library or a reference data library.

30. The computer-implemented method of claim 1, the structured input file comprising one or more directive files including a cross-reference file, a table attributes file or a generation environment file.

31. The computer-implemented method of claim 1, comprising building the data generator program using one or more program code libraries including an emitter library, composite library, include library and post-include library.

32. The article of claim 15, further comprising instructions that when executed enable the processor to generate user error reports when producing the data generator program in response to errors in the structured input file.

33. The article of claim 15, further comprising instructions that when executed enable the processor to compile a source code version of the data generator program into an executable code version of the data generator program.

34. The article of claim 15, further comprising instructions that when executed enable the processor to generate the simulated data for the simulation database by the data generator program.

35. The article of claim 15, further comprising instructions that when executed enable the processor to produce the data generator program as a set of subprograms organized to concurrently generate simulated data for defined tables of the simulation database.

36. The article of claim 15, further comprising instructions that when executed enable the processor to produce the data generator program as a set of subprograms organized to sequentially generate simulated data for defined tables of the simulation database.

37. The article of claim 15, the structured input file comprising one or more data libraries including a database definition data library, an initial values data library, a data view data library, a rules data library or a reference data library.

38. The article of claim 15, the structured input file comprising one or more directive files including a cross-reference file, a table attributes file or a generation environment file.

39. The article of claim 15, further comprising instructions that when executed enable the processor to build the data generator program using one or more program code libraries including an emitter library, composite library, include library and post-include library.

40. The article of claim 15, further comprising instructions that when executed enable the processor to compile a source code version of the data generator program into an executable code version of the data generator program.

41. The apparatus of claim 23, the program builder component operative to select program code modules from multiple code sources based on the structured input file to produce the data generator program.

42. The apparatus of claim 23, the program builder component operative to write selected program code modules to the data generator program.

43. The apparatus of claim 23, the program builder component operative to produce the data generator program as a set of subprograms, each subprogram associated with one of the multiple data generating sessions to generate a portion of the simulated data for a portion of the simulation database.

44. The apparatus of claim 23, the data generator program operative to generate simulated data for tables of the simulation database using multiple computational phases until all tables for the simulation database are populated.

45. The apparatus of claim 23, the data generator program operative to generate simulated data for tables of the simulation database using multiple computational phases, each computational phase comprising a set of simultaneously executed work units followed by a synchronization point, each work unit comprising an expansion phase, a subassembly phase, a final assembly phase, and a cleanup phase.

46. The apparatus of claim 23, the program builder component operative to produce the data generator program as a set of subprograms organized to sequentially generate simulated data for the simulation database in multiple computational phases, with a first computational phase to generate simulated data for independent tables of the simulation database and a second computational phase to generate simulated data for dependent tables from the independent tables.

47. The apparatus of claim 23, the program builder component operative to produce the data generator program as a set of subprograms organized to concurrently generate simulated data for defined tables of the simulation database.

48. The apparatus of claim 23, the program builder component operative to produce the data generator program as a set of subprograms organized to sequentially generate simulated data for defined tables of the simulation database.

49. The apparatus of claim 23, the data generator program operative to synchronize output from multiple computational phases at a synchronization point for each computational phase.

* * * * *